United States Patent
Pak et al.

(10) Patent No.: US 10,756,091 B2
(45) Date of Patent: Aug. 25, 2020

(54) SEMICONDUCTOR DEVICE AND METHOD FOR FABRICATING THE SAME

(71) Applicant: SAMSUNG ELECTRONICS CO., LTD., Suwon-si, Gyeonggi-Do (KR)

(72) Inventors: Ji Ung Pak, Suwon-si (KR); Won Chul Lee, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/279,360

(22) Filed: Feb. 19, 2019

(65) Prior Publication Data

US 2019/0189619 A1    Jun. 20, 2019

Related U.S. Application Data

(62) Division of application No. 15/725,517, filed on Oct. 5, 2017, now Pat. No. 10,283,509.

(30) Foreign Application Priority Data

Dec. 9, 2016    (KR) ........................ 10-2016-0167450

(51) Int. Cl.
*H01L 27/108*    (2006.01)
*H01L 27/11*    (2006.01)
(Continued)

(52) U.S. Cl.
CPC .......... *H01L 27/10855* (2013.01); *G11C 7/12* (2013.01); *G11C 11/416* (2013.01);
(Continued)

(58) Field of Classification Search
CPC ......... H01L 27/10855; H01L 27/10852; H01L 27/1116; H01L 27/11293; H01L 21/285;
(Continued)

(56) References Cited

U.S. PATENT DOCUMENTS 8,912,629 B2    12/2014    Seo
9,053,971 B2    6/2015    Park et al.
(Continued)

FOREIGN PATENT DOCUMENTS

| KR | 1020140028752 | 3/2014 |
|---|---|---|
| KR | 1020140066186 | 5/2014 |
| KR | 1020140087367 | 7/2014 |

*Primary Examiner* — Patricia D Reddington
(74) *Attorney, Agent, or Firm* — F. Chau & Associates, LLC

(57) ABSTRACT

A semiconductor device is provided. The semiconductor device includes a substrate which includes a cell region including first and second regions, and a peri region more adjacent to the second region than adjacent to the first region, first and second lower electrodes disposed in the first and second regions, respectively, first and second lower support patterns disposed on outer walls of the first and second lower electrodes, respectively, an upper support pattern disposed on outer walls of the first and second lower electrodes, and being on and spaced apart from the first and second lower support patterns, a dielectric layer disposed on surfaces of the first and second lower electrodes, the first and second lower support patterns, and the upper support pattern, and an upper electrode disposed on a surface of the dielectric layer, wherein thickness of the first lower support pattern is smaller than thickness of the second lower support pattern.

20 Claims, 24 Drawing Sheets

(51) Int. Cl.
*G11C 11/416* (2006.01)
*H01L 21/285* (2006.01)
*G11C 7/12* (2006.01)
*G11C 11/56* (2006.01)
*H01L 49/02* (2006.01)
*H01L 27/112* (2006.01)
*G11C 5/02* (2006.01)
*G11C 11/403* (2006.01)
*G11C 11/412* (2006.01)

(52) U.S. Cl.
CPC .......... *G11C 11/565* (2013.01); *H01L 21/285* (2013.01); *H01L 21/28568* (2013.01); *H01L 27/10852* (2013.01); *H01L 27/1116* (2013.01); *H01L 27/11293* (2013.01); *H01L 28/92* (2013.01); *H01L 49/02* (2013.01); *G11C 5/025* (2013.01); *G11C 11/403* (2013.01); *G11C 11/412* (2013.01); *H01L 27/10814* (2013.01); *H01L 28/60* (2013.01); *H01L 28/90* (2013.01); *H01L 28/91* (2013.01)

(58) Field of Classification Search
CPC ... H01L 21/28568; H01L 28/92; H01L 49/02; H01L 28/90; H01L 28/60; G11C 7/12; G11C 11/416; G11C 11/565
See application file for complete search history.

(56) References Cited

U.S. PATENT DOCUMENTS

| | | |
|---|---|---|
| 9,142,558 B2 | 9/2015 | Yang et al. |
| 9,263,536 B2 | 2/2016 | Kim et al. |
| 2009/0039404 A1 | 2/2009 | Cho et al. |
| 2011/0306197 A1 | 12/2011 | Kim et al. |
| 2012/0040528 A1 | 2/2012 | Kim et al. |
| 2012/0235279 A1* | 9/2012 | Seo .................. H01L 27/10852 257/532 |
| 2013/0005110 A1 | 1/2013 | Yoon et al. |
| 2013/0223140 A1* | 8/2013 | Sohn .................. G11C 11/1675 365/158 |
| 2016/0027743 A1 | 1/2016 | Kakisaki |
| 2018/0166449 A1 | 6/2018 | Pak et al. |

* cited by examiner

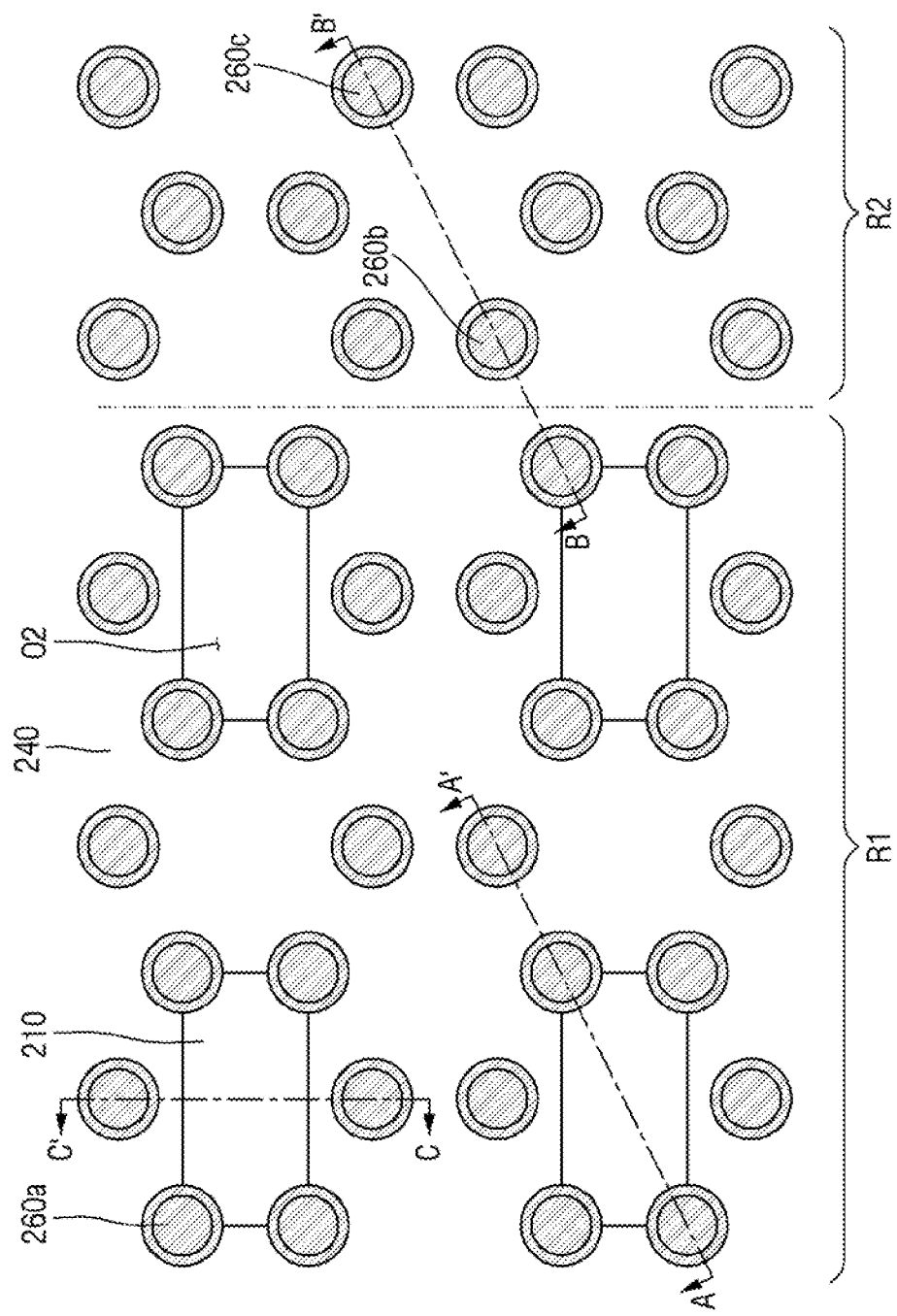

SEMICONDUCTOR DEVICE AND METHOD FOR FABRICATING THE SAME

CROSS-REFERENCE TO RELATED APPLICATION

This application is a divisional application of U.S. patent application Ser. No. 15/725,517, filed on Oct. 5, 2017, which claims priority under 35 U.S.C. § 119 to Korean Patent Application No. 10-2016-0167450, filed on Dec. 9, 2016, in the Korean intellectual Property Office, the disclosures of which we herein incorporated by reference in their entirety.

TECHNICAL FIELD

The present inventive concept generally relates to a semiconductor device and a method for fabricating the same. More particularly, the present inventive concept relates to a semiconductor device with increased capacitance without the risk of cracking, and a method for fabricating the same.

DISCUSSION OF RELATED ART

Recently, to meet the demand for a larger storage capacity and a higher degree of integration in semiconductor devices such as dynamic random access memory (DRAM) and static random access memory (SRAM) devices, cell sizes and design rules have continuously shrunk. In addition, for the DRAM device to operate, a capacitance at a certain level or higher is required for each cell. Accordingly, studies have been made on a method of utilizing a dielectric layer having a high dielectric constant for a capacitor, or a method of increasing a contact area between a lower electrode of the capacitor and the dielectric layer.

To provide a capacitance at a certain level or higher, a lower electrode having a high aspect ratio has been studied. As the aspect ratio of the lower electrode increases, leaning or bending in the lower electrode frequently occurs during the process of removing the mold layer (e.g., a deep-out process). To solve such a problem, a capacitor equipped with a support pattern for connecting adjacent lower electrodes has been introduced.

SUMMARY

An aspect of the present inventive concept provides a semiconductor device with increased capacitance without the risk of cracking.

Another aspect of the present inventive concept provides a method for fabricating a semiconductor device in which the capacitance is increased without risk of cracks.

The aspects of the present inventive concept are not limited to those mentioned above and other aspects which have not been mentioned will be clearly understood by those skilled in the art from the following description.

According to an aspect of the present inventive concept, there is provided a semiconductor device comprising: a substrate which includes a cell region including first and second regions, and a peri region more adjacent to the second region than adjacent to the first region; first and second lower electrodes disposed in the first and second regions, respectively; first and second lower support patterns disposed on outer walls of the first and second lower electrodes, respectively; an upper support pattern disposed on outer walls of the first and second lower electrodes, and being on and spaced apart from the first and second lower support patterns; a dielectric layer disposed on surfaces of the first and second lower electrodes, the first and second lower support patterns, and the upper support pattern; and an upper electrode disposed on a surface of the dielectric layer, wherein thickness of the first lower support pattern is smaller than thickness of the second lower support pattern.

According to another aspect of the present inventive concept, there is provided a semiconductor device comprising: a substrate which includes a cell region including first and second regions, and a peri region more adjacent to the second region than adjacent to the first region; a lower electrode disposed in the cell region, and extending in a first direction intersecting with the substrate; a lower support pattern disposed on an outer wall of the lower electrode; an upper support pattern disposed on an outer wall of the lower electrode, and being on and spaced apart from the lower support pattern in the first direction; a dielectric layer disposed on surfaces of the lower electrode, the lower support pattern, and the upper support pattern; and first and second upper electrodes disposed on a surface of the dielectric layer of the first and second regions, respectively, wherein a length of the first upper electrode extending in the first direction between the lower support pattern and the upper support pattern is larger than a length of the second upper electrode extending in the first direction between the lower support pattern and the upper support pattern.

According to another aspect of the present inventive concept, there is provided a method for fabricating a semiconductor device comprising: providing a substrate which includes a cell region including first and second regions, and a peri region more adjacent to the second region than adjacent to the first region, and also includes contact plugs in the cell region with top surfaces exposed; sequentially forming an etching stopper layer, a lower mold layer, a lower support layer, an upper mold layer and an upper support layer on the substrate; forming contact holes extending in a first direction intersecting with the substrate through the upper support layer, the upper mold layer, the lower support layer, the lower mold layer and the etching stopper layer through patterned etching to expose the contact plugs in the first and second regions; forming a first lower electrode on a sidewall and a bottom of the contact hole in the first region to be electrically connected to the contact plug, and a second lower electrode on a sidewall and a bottom of the contact hole in the second region to be electrically connected to the contact plug; removing a part of the upper support layer through patterned etching in the first region to form an upper support pattern including a first opening; removing the upper mold layer through the first opening; removing a part of the lower support layer using the upper support pattern as an etching mask through etching to form a first lower support pattern including a second opening in the first region, and to form a second lower support pattern in the second region; removing the lower mold layer through the second opening; forming a dielectric layer on surfaces of the first and second lower electrodes, the first and second lower support patterns, and the upper support pattern; and forming first and second upper electrodes on a surface of the dielectric layer of the first and second regions, respectively, wherein thickness of the first lower support pattern is smaller than thickness of the second lower support pattern.

BRIEF DESCRIPTION OF THE DRAWINGS

Exemplary embodiments of the present inventive concept will be more clearly understood from the following detailed description taken in conjunction with the accompanying drawings, in which.

Figure 1:
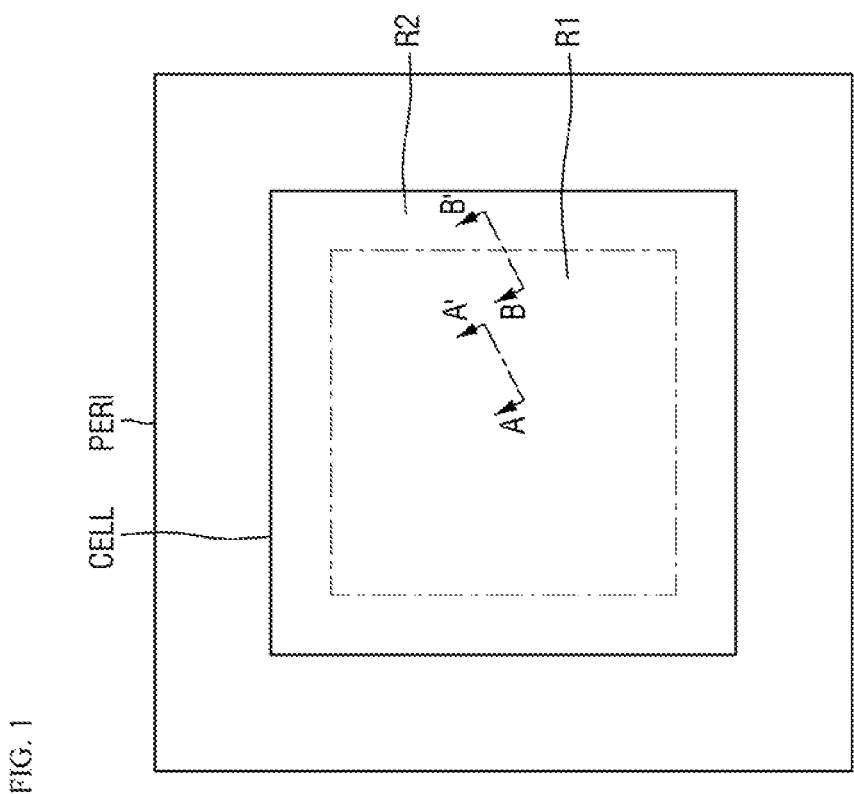
FIG. 1 is a layout diagram of a semiconductor device according to an exemplary embodiment of the present inventive concept.

Since the drawings in FIGS. 1-17 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, a layout of a semiconductor device according to an exemplary embodiment of the present inventive concept will be described with reference to FIGS. 1 and 2.

FIG. 1 is a layout diagram of a semiconductor device according to an exemplary embodiment of the present inventive concept. FIG. 2 is an enlarged view of a part of a cell region of FIG. 1.

FIG. 1 illustrates a layout before a capacitor of a semiconductor device is formed.

Referring to FIG. 1, a substrate (100 in FIG. 3) includes a cell region CELL and a peri region PERI.

The cell region CELL is a region in which memory cells are formed on the substrate. The peri region PERI is a region formed around the cell region CELL.

The cell region CELL may include first and second regions R1 and R2.

The first region R1 may be a region formed at a central portion of the cell region CELL. The second region R2 may be a region which is formed around the first region R1 and is adjacent to the peri region PERI. That is, the second region R2 may be disposed more adjacent to the peri region PERI as compared to the first region R1, and is interposed between the first region R1 and the peri region PERI.

The second region R2 may be a region in which dummy memory cells are formed. That is, the memory cells thrilled in the second region R2 may be memory cells that are formed for the uniformity of the memory cells formed in the first region R1, without functioning as the memory cells in the semiconductor device.

Figure 2:
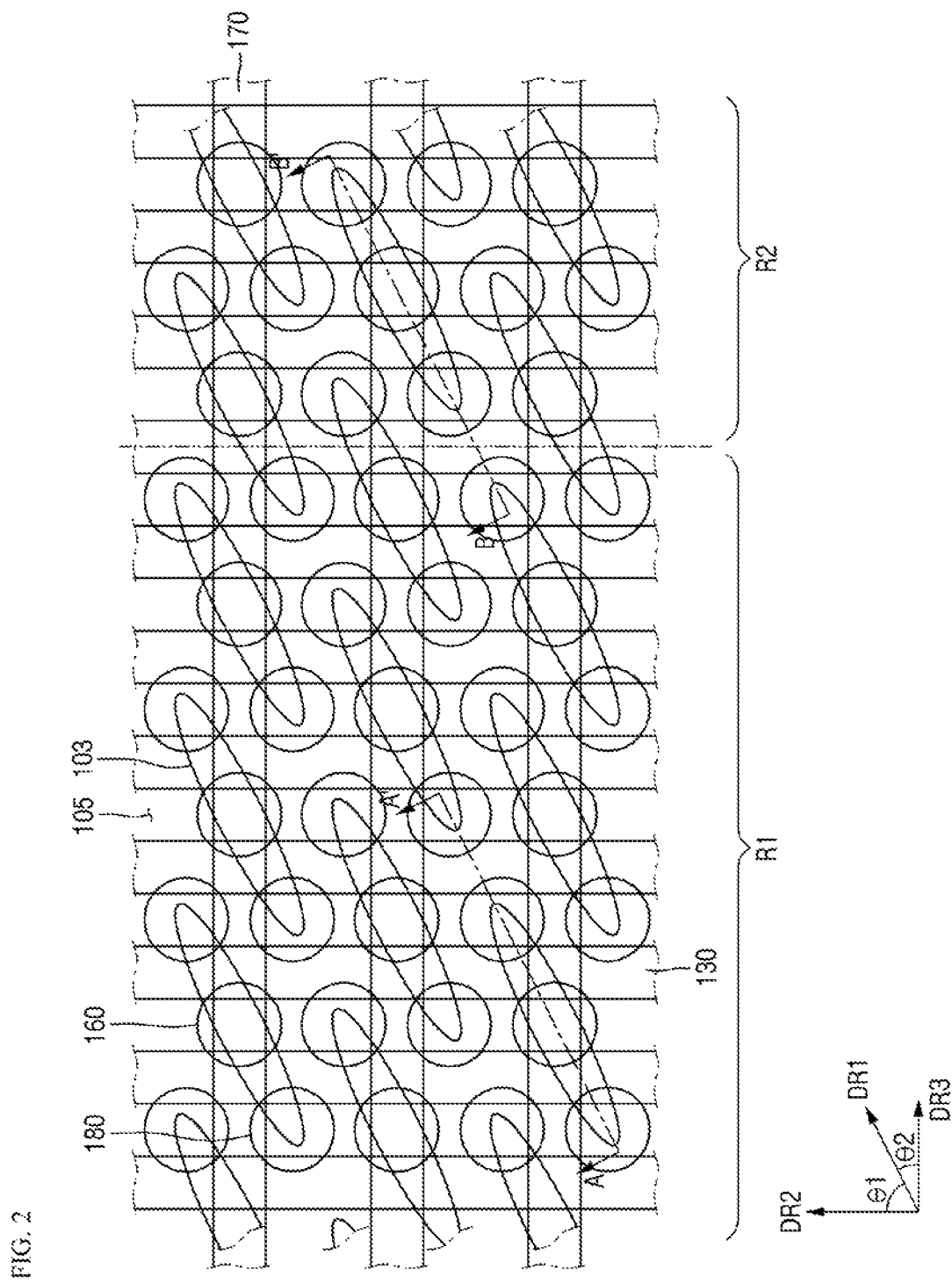
FIG. 2 is an enlarged view of a part of a cell region of FIG. 1.

Referring to FIG. 2, a semiconductor device according to an exemplary embodiment of the present inventive concept includes a unit active region 103, an element isolation region 105, a word line 130, a first contact plug 160, a bit line 170 and a second contact plug 180.

Figure 3:
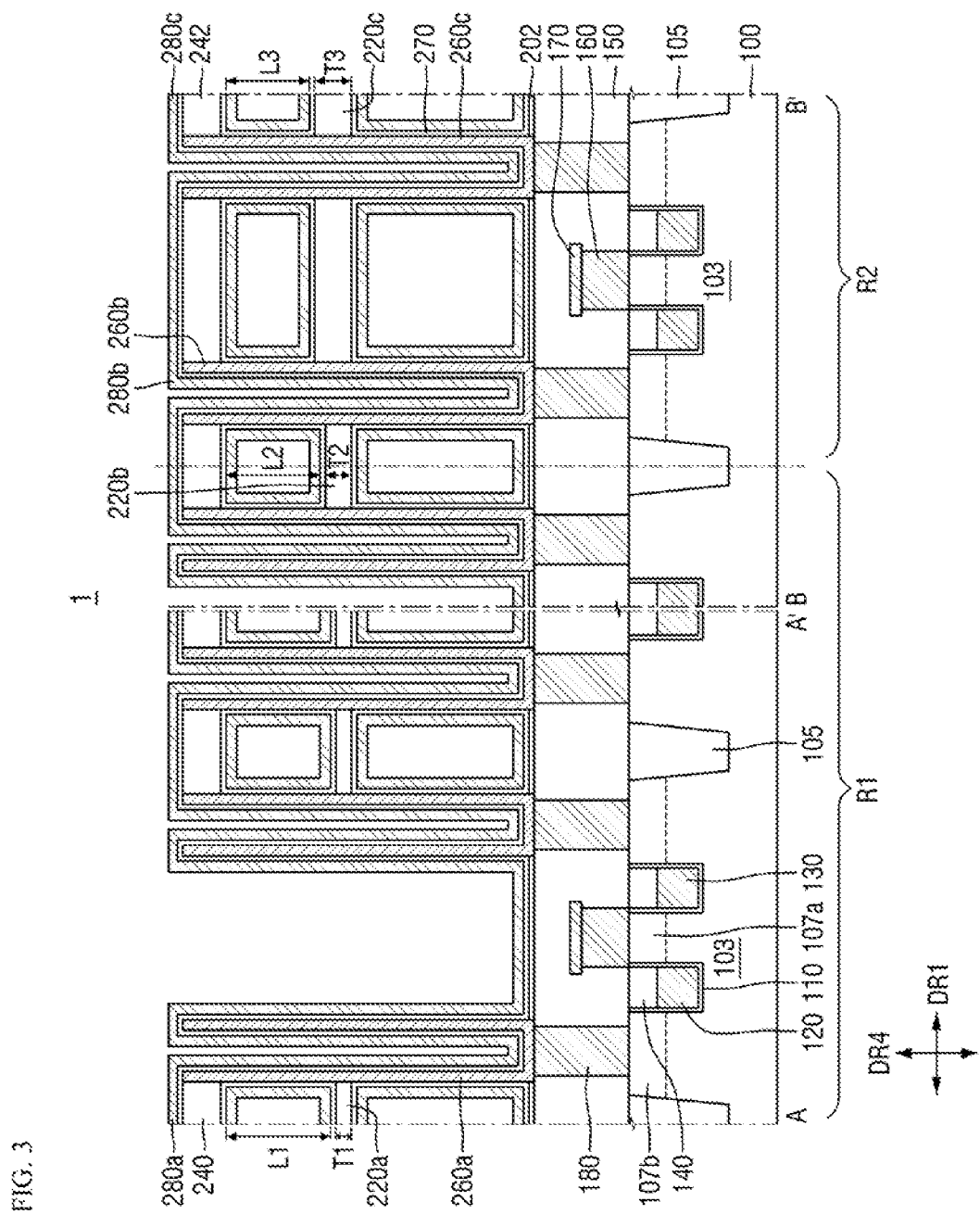
FIG. 3 is a diagram illustrating a semiconductor device according to an exemplary embodiment of the present inventive concept.

The unit active region 103 may be defined by forming the element isolation region 105 in the substrate (100 in FIG. 3). The element isolation region 105 may include silicon oxide or a silicon oxide-based insulating material. Specifically, the unit active region 103 may extend in a first direction DR1.

The word line 130 may extend in a second direction DR2 which forms an acute angle with the first direction DR1, and the bit line 170 may extend in a third direction DR3 which forms an acute angle with the first direction DR1.

Here, the angle in the case where "a specific direction and another specific direction form a predetermined angle" means a small angle among the two angles generated by the intersection of the two directions. For example, when the angles which can be generated by intersection of the two directions are 120° and 60°, the angle means 60°. Therefore, as illustrated in FIG. 1, the angle formed between the first direction DR1 and the second direction DR2 is θ1, and the angle formed between the first direction DR1 and the third direction DR3 is θ2.

The reason of making θ1 and/or θ2 form an acute angle is to maximally secure the interval (i.e., at a maximum possible distance) between the first contact plug 160 connecting the unit active region 103 with the bit line 170 and the second contact plug 180 connecting the unit active region 103 with a capacitor.

The angles θ1 and θ2 may be 60° and 30°, respectively. In such a case, the first contact plug 160 and the second contact plug 180 may be arranged in the form of a hexagonal honeycomb, with the first contact plug 160 at the center of the hexagon. However, the present disclosure is not limited thereto, and the second contact plug 180 may be arranged in various forms. For example, the angles θ1 and θ2 may both be 45°, and the second contact plug 180 may be arranged in the form of a tetragon.

Hereinafter, referring to FIG. 3, a semiconductor device 1 according to an exemplary embodiment of the present inventive concept will be described. For the sake of convenience, the repeated parts of those described with reference to FIGS. 1 and 2 will be briefly described or omitted.

FIG. 3 is a diagram illustrating a semiconductor device according to an exemplary embodiment of the present inventive concept. FIG. 3 is a cross-sectional view taken along line A-A' and line B-B' of FIGS. 1 and 2.

Referring to FIG. 3, the semiconductor device 1 includes a substrate 100, first to third lower electrodes 260a, 260b and 260c, first to third lower support patterns 220a, 220b and 220c, an upper support pattern 240, a capacitor dielectric layer 270, and first to third upper electrodes 280a, 280b and 280c.

The substrate 100 may have a structure in which a base substrate and an epitaxial layer are laminated, but the present disclosure is not limited thereto. The substrate 100 may be, for example, a silicon substrate, a gallium arsenide substrate, a silicon germanium substrate, a ceramic substrate, a quartz substrate, a display glass substrate, or the like, and may be a semiconductor on insulator substrate (SOI). Hereinafter, a silicon substrate will be described as an example. Further, the substrate 100 may be doped with impurities. For example, the substrate 100 may be doped with P-type impurities.

The bit line 170 and the word line 130 may be disposed between the substrate 100 and the first to third lower electrodes 260a, 260b and 260c.

The unit active region 103 and the element isolation region 105 may be formed in the substrate 100. At this time, two transistors may be formed in a single unit active region 103. The two transistors may include two word lines 130 extending in the second direction DR2 formed to cross the unit active region 103 extending in the first direction DR1. The gates of the transistors may be connected to the word lines 130. Further, the two transistors may include a first source/drain region 107a formed in the unit active region 103 between the two word lines 130, and a second source/drain region 107b formed between each word line 130 and the element isolation region 105. In other words, each word line 130 may be disposed between the first and second source/drain regions 107a and 107b. That is, the two transistors may share the first source/drain region 107a, and may not share the second source/drain region 107b. The bit line 170 extending in the third direction DR3 may be electrically connected to the first source/drain region 107a of the transistors.

The gate insulating layer 120 may be formed along sidewalls and a bottom surface of the first trench 110 formed in the substrate 100. The gate insulating layer 120 may include, for example, a high-dielectric constant (high-k) dielectric having a dielectric constant higher than that of silicon oxide or silicon nitride, for example, having a dielectric constant of about 10 to about 25. For example, the high-k dielectric may include at least one of hafnium oxide, lanthanum oxide, zirconium oxide, tantalum oxide, titanium oxide, yttrium oxide, aluminum oxide, and combinations thereof.

The word line 130 may be formed to partially fill the first trench 110, without completely filling the first trench 110. That is, the word line 130 may be in a recessed form. The word line 130 may be formed of, for example, doped polysilicon, titanium nitride (TiN), tantalum nitride (TaN), tungsten nitride (WN), titanium (Ti), tantalum (Ta), tungsten (W) or the like, but the present disclosure is not limited thereto.

A capping pattern 140 may be formed on the word line 130 to fill the first trench 110. The capping pattern 140 may include an insulating material, and may include, for example, at least one of silicon oxide, silicon nitride and silicon oxynitride.

The interlayer insulating layer 150 may be formed on the substrate 100. The interlayer insulating layer 150 may include, for example, at least one of silicon oxide, silicon nitride and silicon oxynitride. Further, the interlayer insulating layer 150 may be a single layer or multiple layers. An etching stopper layer 202 may be formed over the interlayer insulating layer 150.

The first contact plug 160 may be formed to be electrically connected to the first source/drain region 107a inside the interlayer insulating layer 150. The first contact plug 160 may include a conductive material. For example, the first contact plug 160 may include at least one of polycrystalline silicon, a metal silicide compound, a conductive metal nitride, and a metal, but the present disclosure is not limited thereto.

The bit line 170 may be formed to be on and electrically connected to the first contact plug 160. The bit line 170 may include a conductive material and may include, for example, at least one of polycrystalline silicon, a metal silicide compound, a conductive metal nitride and a metal, but the present disclosure is not limited thereto.

The second contact plug 180 may be formed inside and to pass through the interlayer insulating layer 150. The second contact plug 180 may be electrically connected to the second source/drain region 107b. That is, the second contact plug 180 may be a storage node contact. A capacitor may be electrically connected with the storage node contact, i.e., the second contact plug 180. The second contact plug 180 may include a conductive material and may include, for example, at least one of polycrystalline silicon, a metal silicide compound, a conductive metal nitride, and a metal. However, the present disclosure is not limited thereto.

The first to third lower electrodes 260a, 260b and 260c may be formed on the substrate 100. Specifically, the first lower electrode 260a may be formed in the first region R1, and the second and third lower electrodes 260b and 260c may be formed in the second region R2. At this time, the second lower electrode 260b may be more adjacent to the first region R1 than the third lower electrode 260c. That is, the third lower electrode 260c may be more adjacent to the peri region (PERI of FIG. 1) than the second lower electrode 260b.

The first to third lower electrodes 260a, 260b and 260c are formed on the interlayer insulating layer 150 which covers the word line 130 and the bit line 170, and may be electrically connected to the second contact plug 180. Further, the first to third lower electrodes 260a, 260b and 260c may be formed to extend in the fourth direction DR4. The fourth direction DR4 is perpendicular to the first, second and third directions D1, D2 and DR3. That is, the first to third lower electrodes 260a, 260b and 260c may extend long in the thickness direction of the substrate 100.

In the semiconductor device 1 according to an exemplary embodiment of the present inventive concept, the first to third lower electrodes 260a, 260b and 260c may have a cylinder shape, and may have a U-shaped cross-section. Unlike the illustrated configuration, the sidewalls of the first to third lower electrodes 260a, 260b and 260c having a cylinder shape may also have, for example, a shape such as stairs, due to process causes and the like.

The first to third lower electrodes 260a, 260b and 260c may include at least one selected from doped polysilicon, a conductive metal nitride (e.g., titanium nitride, tantalum nitride, tungsten nitride, etc.), a metal (e.g., ruthenium, iridium, titanium, tantalum, etc.) and a conductive metal oxide (e.g., iridium oxide, ruthenium oxide, etc.).

The first to third lower support patterns 220a, 220b and 220c may be disposed between the adjacent lower electrodes. Specifically, the first to third lower support patterns 220a, 220b and 220c are formed on the outer walls of the first to third lower electrodes 260a, 260b and 260c, respectively, and may mutually connect and support the outer walls of the adjacent lower electrodes. That is, the first to third lower support patterns 220a, 220b and 220c may come into direct contact with and wrapping around the outer walls of the first to third lower electrodes 260a, 260b and 260c, respectively.

The first to third lower support patterns 220a, 220b and 220c may have first to third thicknesses T1, T2, and T3, respectively. At this time, the first thickness T1 may be smaller than the second thickness T2, and the second thickness 12 may be smaller than the third thickness T3. For example, the first thickness T1 may be about 80 Å to 200 Å, and the third thickness T3 may be about 250 Å to 400 Å. The second thickness T2 may be greater than the first thickness T1 and smaller than the third thickness T3. For example, the second thickness T2 may be about 250 Å to 300 Å. However, the present disclosure is not limited thereto.

The first thickness T1 of the first lower support pattern 220a disposed in the first region R1 may be smaller than the second thickness T2 of the second lower support pattern 220b disposed in the second region R2. Further, the second thickness T2 of the second lower support pattern 220b may be smaller than the third thickness T3 of the third lower support pattern 220c disposed in the second region R2 at a location which is further spaced apart from the first region R1. That is, the thickness of the lower support pattern may be larger as it approaches the peri region (PERI in FIG. 1).

At this time, the lower surfaces of the first to third lower support patterns 220a, 220b and 220c may be disposed substantially on the same plane. That is, the lower surfaces of the first to third lower support patterns 220a, 220b and 220c are about coplanar.

The upper support pattern 240 may be disposed on the first to third lower support patterns 220a, 220b and 220c, and spaced apart from the first to third lower support patterns 220a, 220b and 220c. That is, the upper support pattern 240 may be disposed on and spaced apart from the first to third lower support patterns 220a, 220b and 220c in the fourth direction DR4. Accordingly, the lower support pattern 220, which includes the first to third lower support patterns 220a, 220b and 220c, may be more adjacent to the substrate 100 than the upper support pattern 240.

In the semiconductor device 1 according to an exemplary embodiment of the present inventive concept, the upper support pattern 240 may be formed on the outer walls of the uppermost parts of the first to third lower electrodes 260a, 260b and 260c. That is, the upper surface of the upper support pattern 240 and the upper surfaces of the first to third lower electrodes 260a, 260b and 260c may be disposed on substantially the same plane. That is, the upper surface of the upper support pattern 240 and the upper surfaces of the first to third lower electrodes 260a, 260b and 260c are about coplanar. Accordingly, the semiconductor device 1 may prevent the first to third lower electrodes 260a, 260b and 260c from leaning on the upper support pattern 240.

The first to third lower support patterns 220a, 220b and 220c, and the upper support pattern may include, for example, at least one of silicon oxynitride, silicon nitride, silicon carbon nitride, and tantalum oxide. At this time, the first to third lower support patterns 220a, 220b and 220c and the upper support pattern 240 may be formed of the same material. However, the present disclosure is not limited thereto, and the first to third lower support patterns 220a, 220b and 220c and the upper support pattern 240 may be formed of materials different from each other.

A capacitor dielectric layer 270 may be formed on the first to third lower electrodes 260a, 260b and 260c, the first to third lower support patterns 220a, 220b and 220c, the etching stopper layer 202, and the upper support pattern 240. Specifically, the capacitor dielectric layer 270 may be formed on the first to third lower electrodes 260a, 260b and 260c, the first to third lower support patterns 220a, 220b and 220c, the etching stopper layer 202, and the upper support pattern 240 in a conformal manner. The capacitor dielectric layer 270 can be made up of a single layer or a plurality of layers.

The capacitor dielectric layer 270 may include at least one of, for example, silicon oxide, silicon nitride, silicon oxynitride and a high dielectric constant (high-k) material. The high dielectric constant (high-k) material may include, for example, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof, but the present disclosure is not limited thereto.

The first to third upper electrodes 280a, 280b and 280c may be formed on the capacitor dielectric layer 270. Specifically, the first to third upper electrodes 280a, 280b and 280c may be formed on the capacitor dielectric layer 270 over the first to third lower electrodes 260a, 260b and 260c in a conformal fashion, respectively. Therefore, when the first to third lower electrodes 260a, 260b and 260c have a cylinder shape, the first to third upper electrodes 280a, 280b and 280c may also have a cylinder shape. Therefore, the upper electrode may include a structure in which some cylinder shapes are connected to each other by a support pattern. In other words, the first to third upper electrodes 280a, 280b and 280c may be formed on the capacitor dielectric layer 270 over the first to third lower electrodes 260a, 260b and 260c, the first to third lower support patterns 220a, 220b and 220c, the etching stopper layer 202, and the upper support pattern 240.

The first to third upper electrodes 280a, 280b and 280c may be formed between the side walls of the first to third lower electrodes 260a, 260b and 260c having a cylinder shape, respectively. That is, the first to third upper electrodes 280a, 280b and 280c may include portions surrounded by the side walls of the first to third lower electrodes 260a, 260b and 260c, respectively.

The first to third upper electrodes 280a, 280b and 280c may include portions extending in the fourth direction DR4 between the first to third lower support patterns 220a, 220b and 220c and the upper support pattern 240. Specifically, the first to third upper electrodes 280a, 280b and 280c may have first to third lengths L1, L2 and L3, respectively, corresponding to these portions. At this time, the first length L1 may be larger than the second length L2, and the second length L2 may be larger than the third length L3.

The first length L1 of the first upper electrode 280a disposed in the first region R1 may be larger than the second length L2 of the second upper electrode 280b disposed in the second region R2. Further, the second length L2 of the second upper electrode 280b may be larger than the third length L3 of the third upper electrode 280c disposed in the second region R2 at a location which is further spaced apart from the first region R1. That is, the length of the upper electrode extending in the fourth direction DR4 between the lower support pattern and the upper support pattern may become smaller as the upper electrode approaches the peri region (PERI in FIG. 1).

In an exemplary embodiment of the present inventive concept, the upper surfaces of the first to third upper electrodes 280a, 280b and 280c extending in the fourth direction DR4 between the first to third lower support patterns 220a, 220b and 220c and the upper support pattern 240 may be disposed on substantially the same plane. Here, this same plane is at the lower surface of the upper support pattern 240. As a result, the lower surfaces of the first to third upper electrodes 280a, 280b and 280c each extending in the fourth direction DR4 between the first to third lower support patterns 220a, 220b and 220c and the upper support pattern 240 may become higher as they approach the peri region (PERI in FIG. 1). The lower surfaces of the first to third upper electrodes 280a, 280b and 280c extending in the fourth direction DR4 between the first to third lower support patterns 220a, 220b and 220c and the upper support pattern 240 are the upper surfaces of the first to third lower support patterns 220a, 220b and 220c, respectively. The thickness of the lower support pattern may be larger as it approaches the peri region as described above, thus the upper surface of the lower support pattern may become higher as it approaches the peri region.

The upper electrode 280, which includes the first to third upper electrodes 280a, 280b and 280c, may include, for example, at least one of doped polysilicon, metal, conductive metal nitride and metal silicide, but the present disclosure is not limited thereto.

Since the lower support pattern comes into direct contact with the lower electrode to support the lower electrode, the capacitor dielectric layer is not disposed on the lower electrode portion on which the lower support pattern is formed. Therefore, when the lower support pattern is thickly formed, the area of the capacitor dielectric layer formed on the lower electrode may be reduced. This may reduce the areas of the lower electrode and the upper electrode facing each other with the capacitor dielectric layer interposed therebetween, thereby reducing the capacitance, which is the capacity of the capacitor.

For a memory device (e.g., DRAM) to operate, a capacitance at a certain level or higher is required for each cell. For example, when the capacitance does not reach a certain level, the refresh characteristics of the DRAM may be degraded and an S/A mismatch (Sense-Amp Miss-Match) defect may occur. Therefore, the thickness of the lower support pattern is required to be thinly formed.

When the lower support pattern is formed to be excessively thin, cracks may occur in the lower support pattern. For example, cracks due to stress applied to the cell region may occur in the lower support pattern. In particular, the edges of the cell region are most vulnerable to stress, and cracks are likely to occur in these areas. Also, cracks of the lower support pattern disposed at the edges of the cell region may cause cracks in the entire cell region.

The semiconductor device according to an exemplary embodiment of the present inventive concept provides a lower support pattern of reduced thickness at the central portion of the cell region. For example, the semiconductor device 1 provides a first lower support pattern 220a with reduced thickness in the first region R1.

In the semiconductor device 1, the thicknesses of the second and third lower support patterns 220b and 220c formed in the second region R2 which is the edge of the cell region (CELL in FIG. 1) are kept large, and the thickness of the first lower support pattern 220a formed in the first region R1 which is the central portion of the cell region may be reduced. As a result, it is possible to prevent cracks in the second and third lower support patterns 220b and 220c disposed in the second region R2 which is vulnerable to the stress.

In the semiconductor device 1, since the first lower support pattern 220a formed in the first region R1 has a reduced thickness, the first upper electrode 280a extending in the fourth direction DR4 between the first lower support pattern 220a and the upper support pattern 240 may extend longer. That is, the area in which the first lower electrode 260a and the first upper electrode 280a face each other, with the capacitor dielectric layer 270 interposed therebetween, may be made wider. Therefore, the capacitance of the semiconductor device 1 may be enhanced. As a result, the semiconductor device of the present inventive concept may have an increased capacitance without the risk of cracking.

Hereinafter, a method for fabricating a semiconductor device according to an exemplary embodiment of the present inventive concept will be described with reference to FIGS. 4 to 15. For the sake of convenience, repeated parts of those described with reference to FIGS. 1 to 3 will be briefly described or omitted.

FIGS. 4 to 15 are intermediate step diagrams for explaining a method for fabricating a semiconductor device according to an exemplary embodiment of the present inventive concept.

Figure 4:
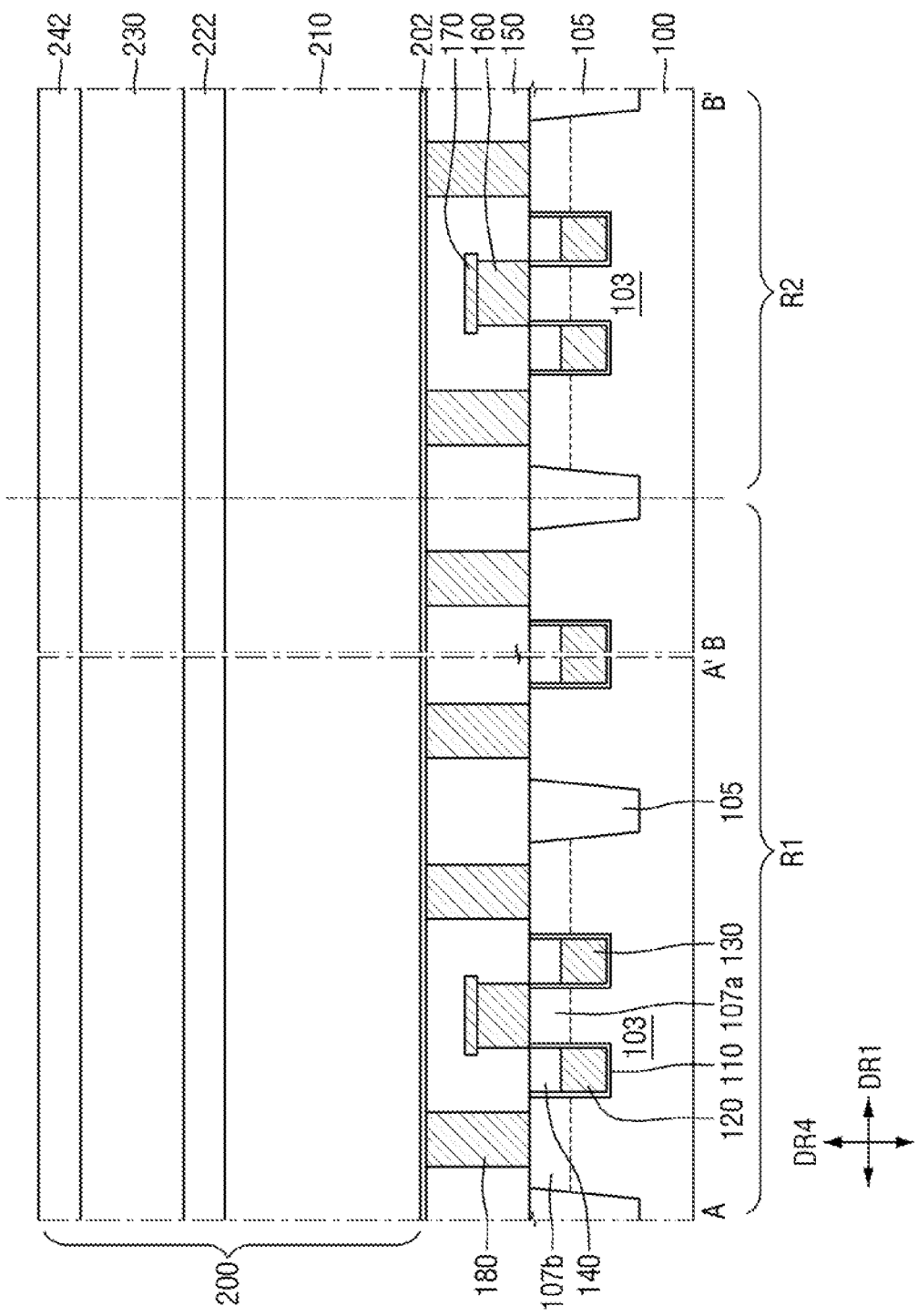
FIGS. 4 to 15 are intermediate step diagrams for explaining a method for fabricating a semiconductor device according to an exemplary embodiment of the present inventive concept.

Referring to FIG. 4, an insulating layer 200 is formed on a substrate 100. The insulating layer 200 may include a lower mold layer 210, a lower support layer 222, an upper mold layer 230, and an upper support layer 242, which are sequentially laminated.

An etching stopper layer 202 is formed on the interlayer insulating layer 150 on which the first contact plug 160 and the second contact plug 180 are formed. The lower mold layer 210, the lower support layer 222, the upper mold layer 230 and the upper support layer 242 may be sequentially formed on the etching stopper layer 202.

The lower mold layer 210 and the upper mold layer 230 containing an oxide may have a high etch selectivity with respect to the material included in the etching stopper layer 202. The etching stopper layer 202 may include, for example, silicon nitride. Further, the etching stopper layer 202 may be formed, for example, by a chemical vapor deposition or the like.

The lower mold layer 210 may be formed on the etching stopper layer 202. The lower mold layer 210 may include silicon oxide. For example, the lower mold layer 210 may be formed of FOX (Flowable Oxide), TOSZ (Tonen SilaZen), USG (Undoped Silica Glass), BSG (Borosilica Glass), PSG (PhosphoSilaca Glass), BPSG (Borophosphosilica Glass), PE-TEOS (Plasma Enhanced Tetra Ethyl Ortho Silicate), FSG (fluoride Silicate Glass), HDP (High Density Plasma) oxide, PEOX (Plasma Enhanced Oxide), FCVD (Flowable CVD) oxide or combinations thereof.

The lower support layer 222 may be formed on the lower mold layer 210. The lower support layer 222 may include a material having an etching selectivity with respect to the material of the lower mold layer 210 and the upper mold layer 230. For example, when the lower mold layer 210 and the upper mold layer 230 contain oxides, the lower support layer 222 may contain at least one of, for example, silicon oxynitride, silicon nitride, silicon carbon nitride, tantalum oxide, and a combination thereof.

The upper mold layer 230 may be formed on the lower support layer 222. The upper mold layer 230 may contain an oxide described as being included in the lower mold layer 210. For example, the upper mold layer 230 may contain PE-TEOS or HDP-CVD oxide. The upper mold layer 230 may be a single layer, but the present disclosure is not limited thereto, and the upper mold layer 230 may be multilayers.

Figure 5:
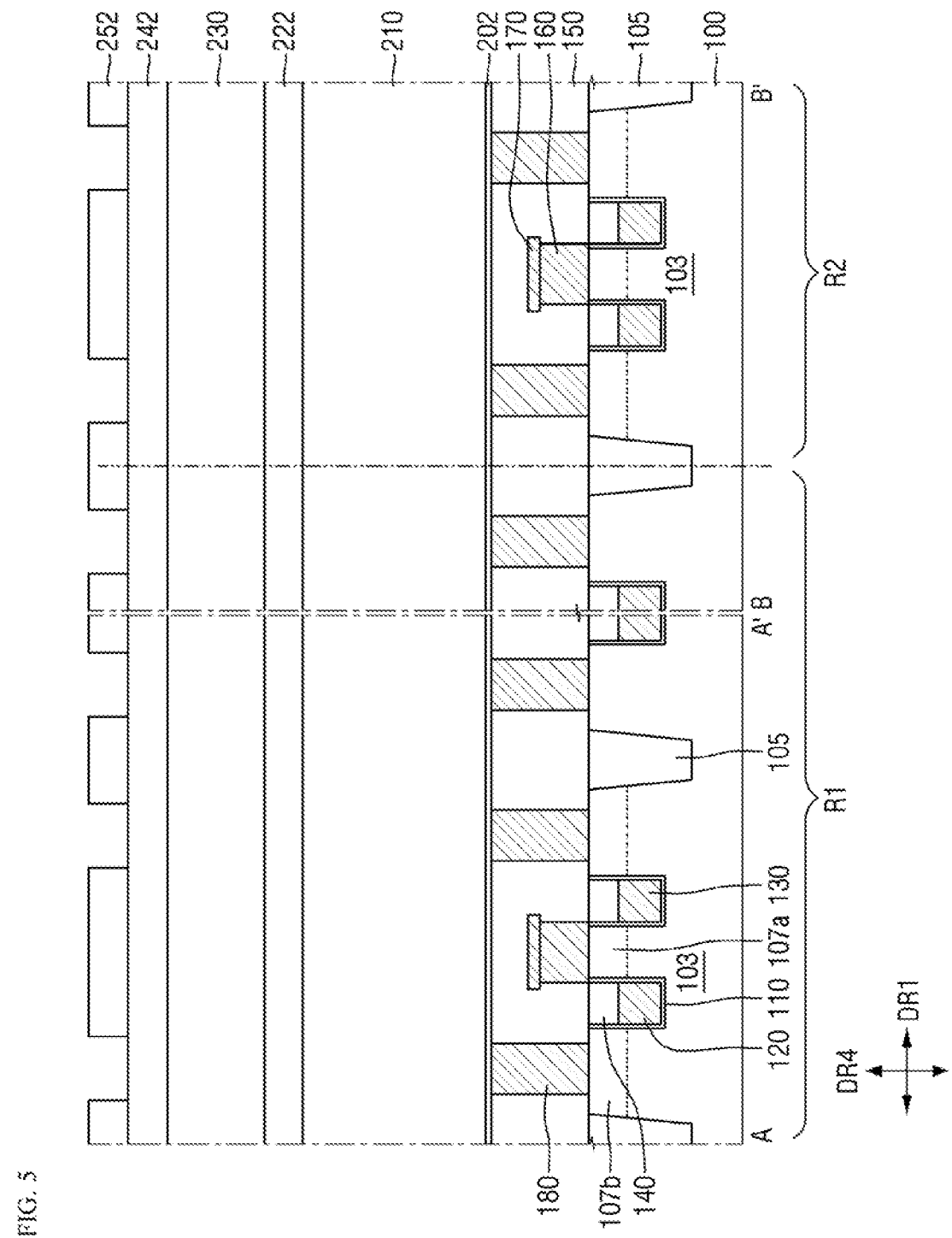

Referring to FIG. 5, a node mask 252 is formed on the insulating layer 200. Specifically, the node mask 252 may be formed on the upper support layer 242.

A mask layer may be formed on the insulating layer 200. The mask layer may contain a material having an etching selectivity with respect to the material of the upper support layer 242. Therefore, the node mask 252, which defines a region where the contact hole (250 in FIG. 6) for the lower electrode (260 in FIG. 8) is formed by etching the mask layer, may be formed on the upper support layer 242. The formation of the node mask 252 may go through a photolithography process to obtain a pattern to define the region where the contact hole is formed.

Figure 6:
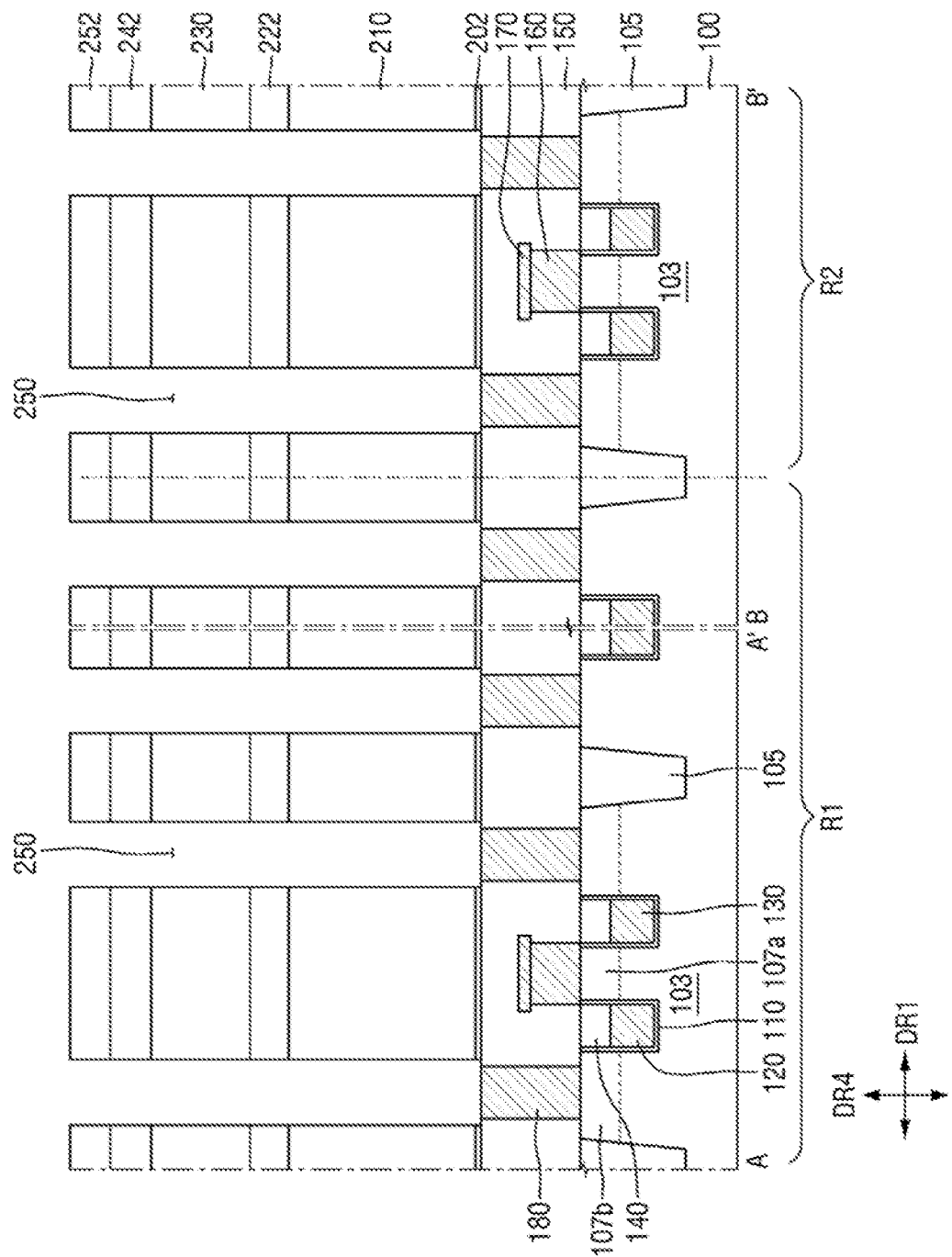

Referring to FIG. 6, a contact hole 250 is formed in the insulating layer 200 through a patterned etching process. The contact hole 250 may be formed by etching the insulating layer 200, using the node mask 252 as an etching mask. Specifically, by etching the upper support layer 242, the upper mold layer 230, the lower support layer 222, the lower mold layer 210 and the etching stopper layer 202, the contact hole 250 may be formed in the insulating layer 200. Thus, the second contact plug 180 may be exposed.

The etching process for forming the contact hole 250 may include, for example, at least one of wet etching and dry etching. Also, the contact hole 250 may be formed through several stages of etching processes. The uniformity of the etching process for etching the contact hole 250 may be better, when the contact hole 250 is formed through several stages of the etching processes.

Figure 7:
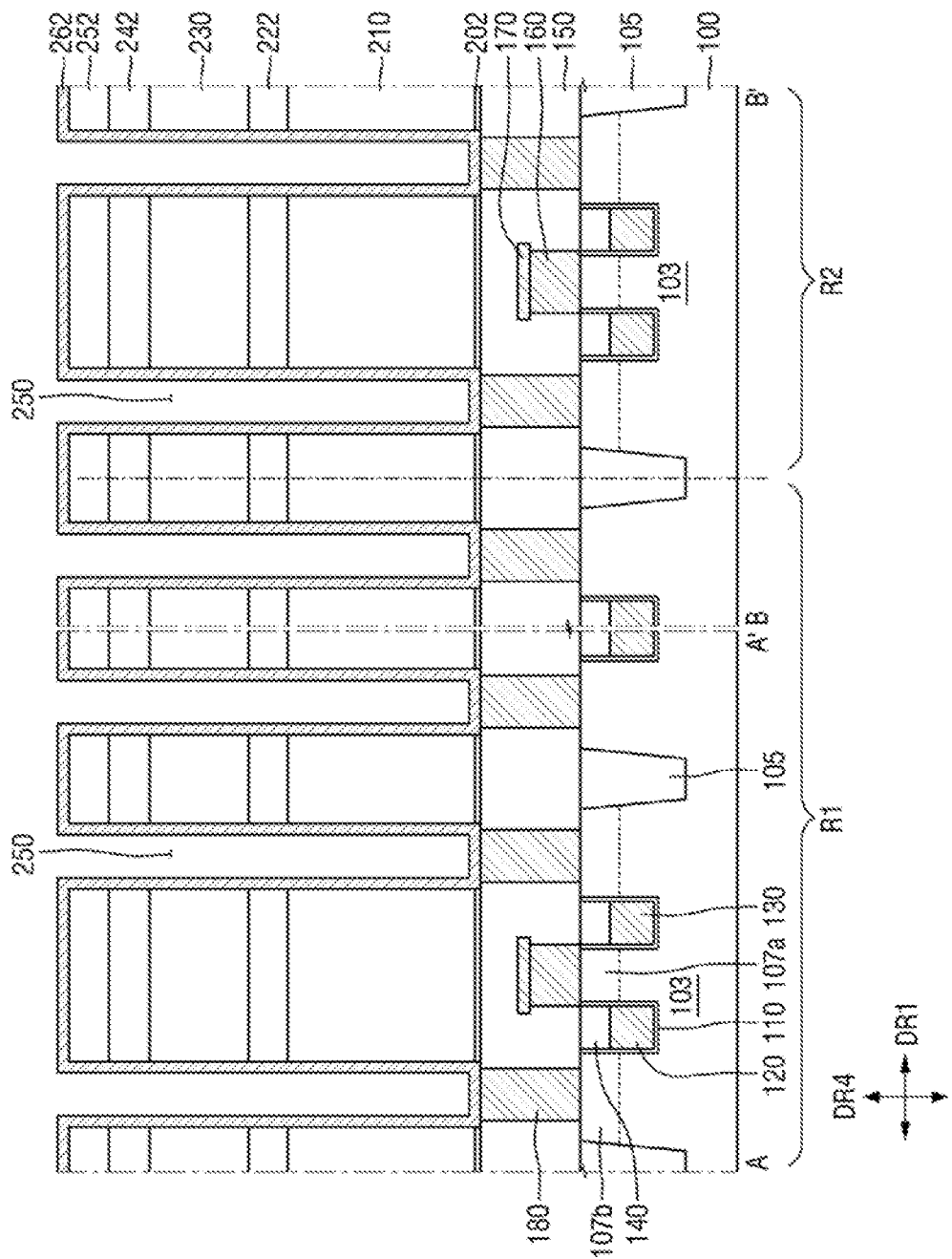

Referring to FIG. 7, the lower electrode layer 262 is formed on the exposed insulating layer 200. Specifically, the lower electrode layer 262 is formed on the upper surface of the exposed second contact plug 180, the inner walls of the contact hole 250, the lower mold layer 210, the lower support layer 222, the upper mold layer 230, the upper support layer 242, and the node mask 252. For example, the lower electrode layer 262 may be formed on the exposed insulating layer 200 in a conformal manner. That is, the lower electrode layer 262 may be formed on the exposed insulating layer 200 in a cylinder shape.

The lower electrode layer 262 may be a conductive material, and for example, the lower electrode layer 262 may contain at least one selected from doped polysilicon, a conductive metal nitride (e.g., titanium nitride, tantalum nitride, tungsten nitride, etc.), a metal (e.g., ruthenium, iridium, titanium, tantalum, etc.), and a conductive metal oxide (e.g., iridium oxide, ruthenium oxide, etc.).

Figure 8:
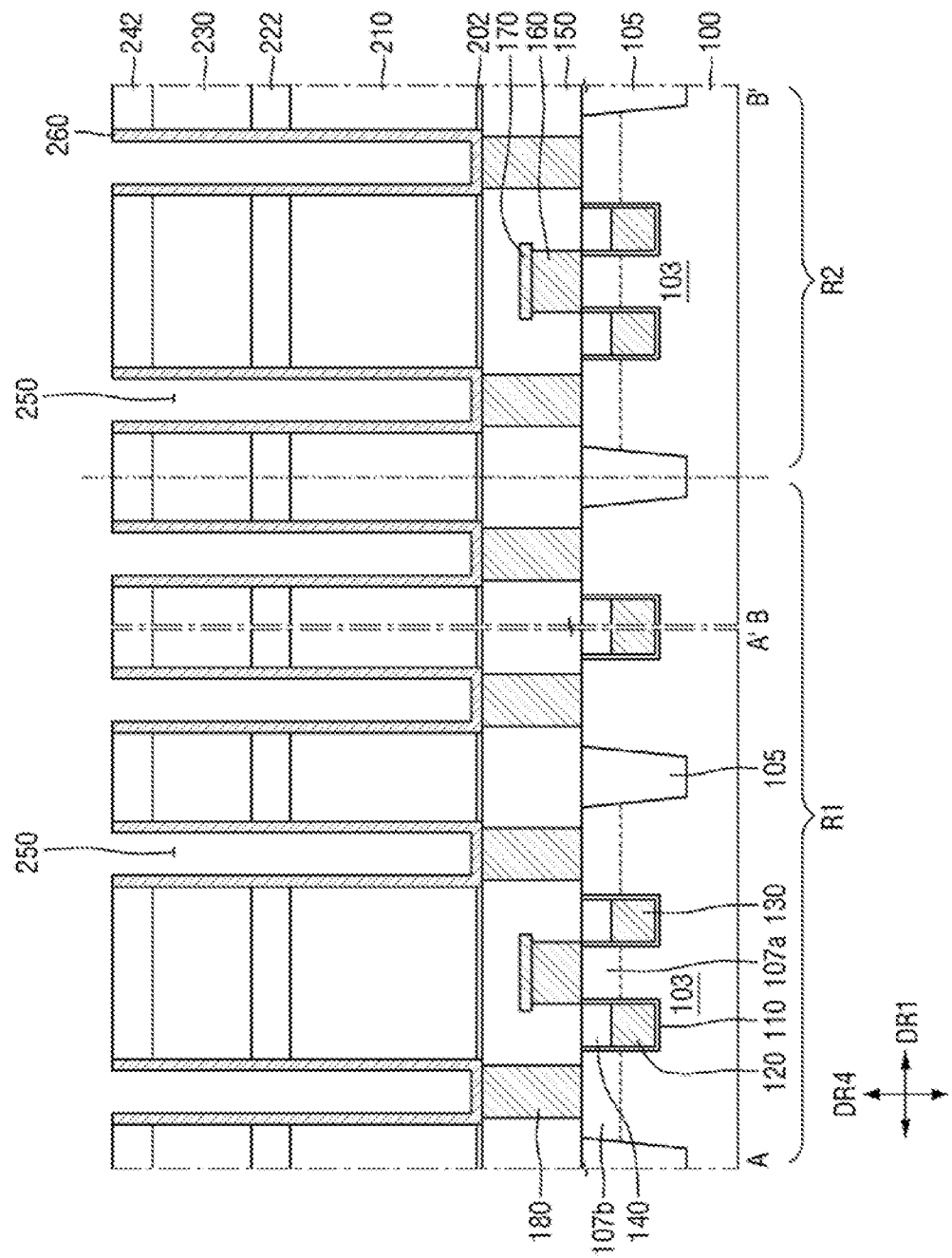

Referring to FIG. 8, the node mask 252 on the upper support layer 242 and a part of the lower electrode layer 262 are removed until the upper support layer 242 is exposed.

The node mask 252 on the upper support layer 242 and a part of the lower electrode layer 262 are removed until the upper support layer 242 is exposed, using a process including at least one of a chemical mechanical polishing (CMP) and an etch back. Accordingly, the lower electrode 260 electrically connected to the second contact plug 180 may be formed in the contact hole 250. Further, each lower electrode 260 may be electrically separated from the neighbouring one.

Figure 9A:
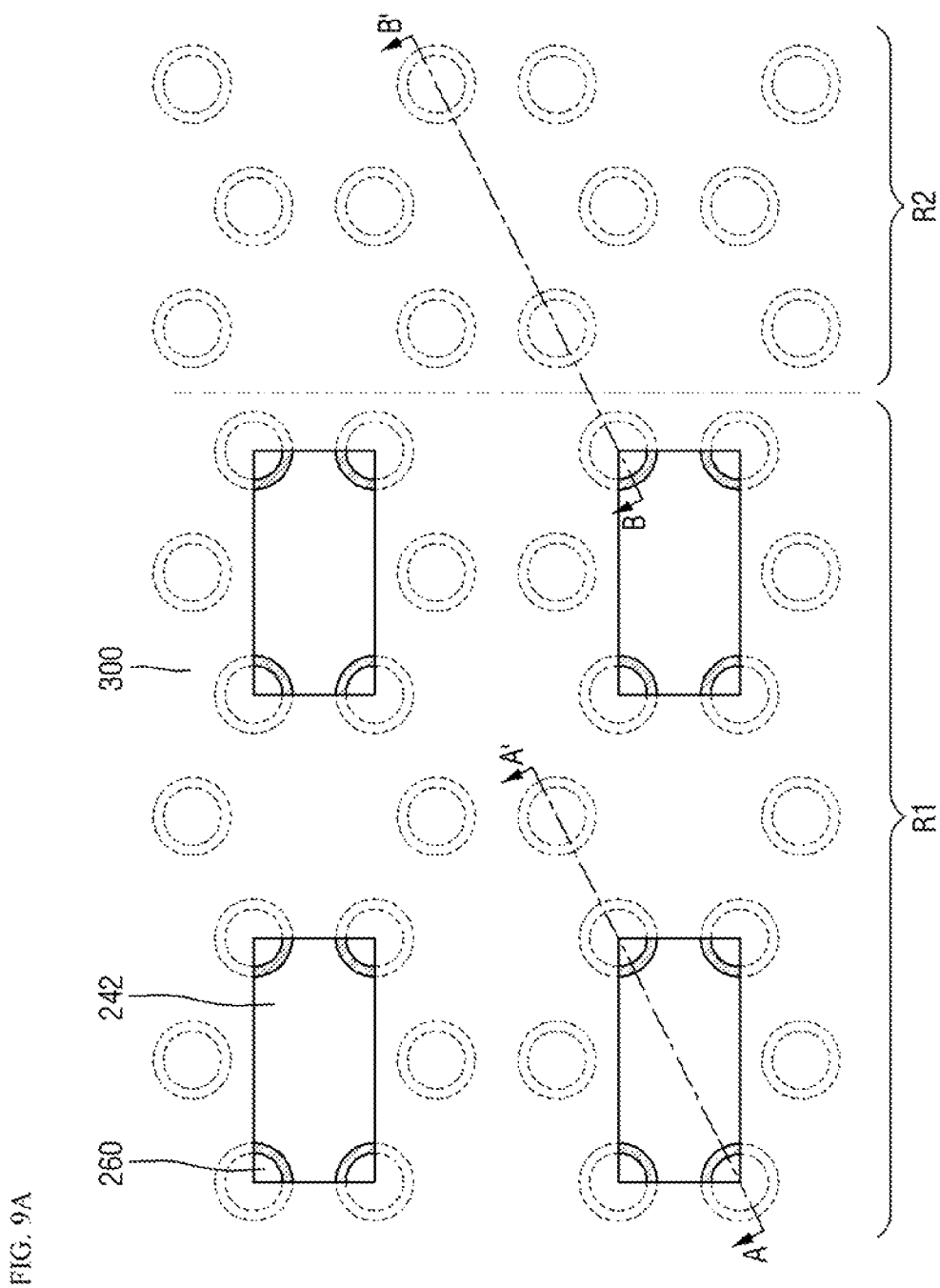
Figure 9B:
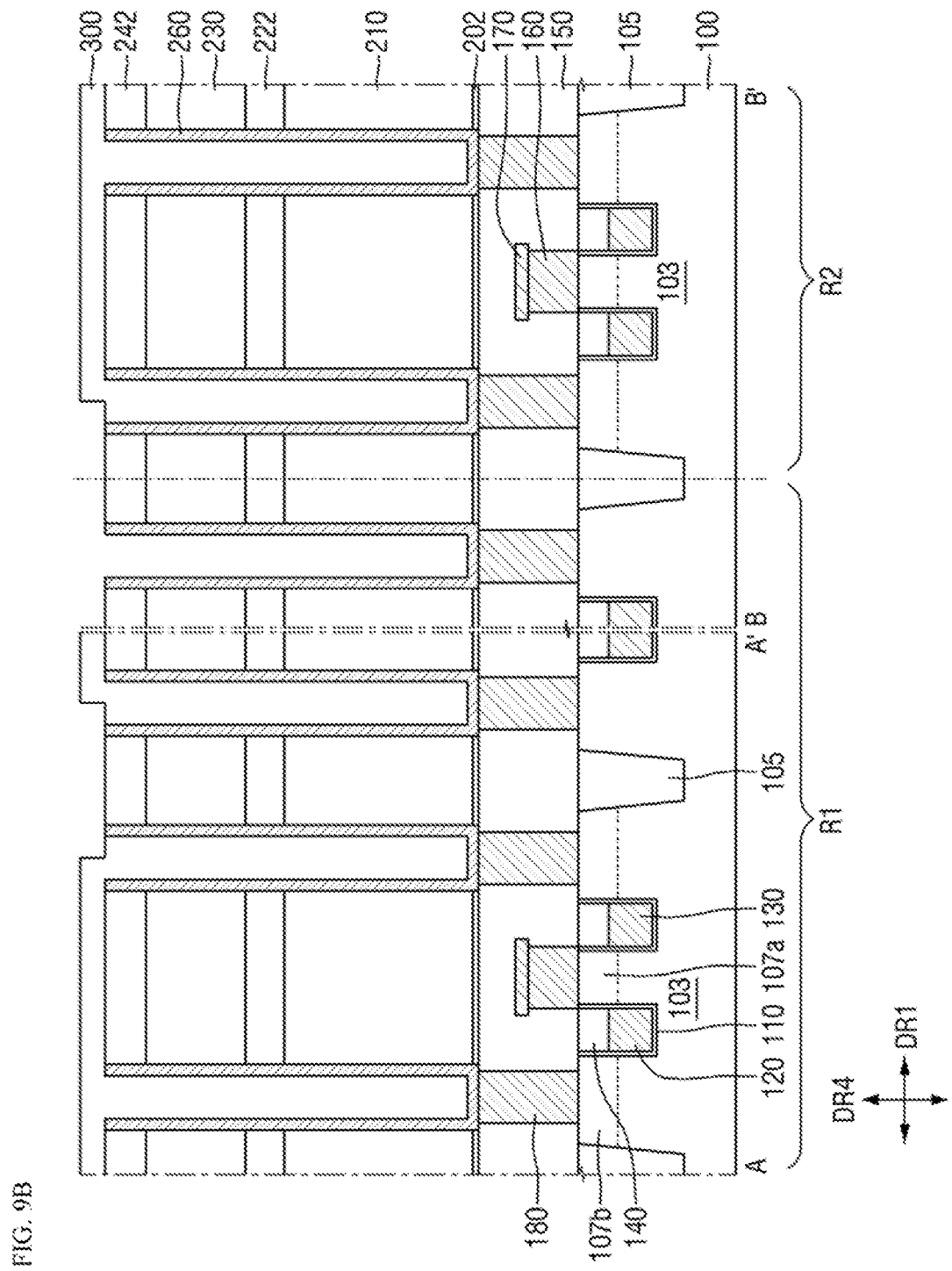

Referring to FIGS. 9A and 9B, a patterned hard mask 300 is formed on the lower electrode 260 and the upper support layer 242.

As illustrated in FIG. 9A, the lower electrode 260 is electrically connected to the second contact plug (180 of FIG. 2), and may be arranged in the form of honeycomb, similarly to the second contact plug 180. Since the lower electrode 260 includes the first, second and third lower electrodes 260a, 260b and 260c, a plurality of first, second and third lower electrodes 260a, 260b and 260e may be arranged in the form of honeycomb. Further, the lower electrode 260 may be formed in a cylinder shape. When the lower electrode 260 is formed in a cylinder shape, the hard mask 300 may fill the interior of the cylinder shape.

At this time, the hard mask 300 may be patterned. For example, the hard mask 300 may go through a photolithography process to obtain a pattern to define a region which exposes the lower electrode 260 and the upper support layer 242 of the first region R1. Specifically, the hard mask 300 may expose some parts of the lower electrode 260 and the upper support layer 242 of the first region R1 and may be patterned throughout the lower electrode 260. In contrast, the hard mask 300 does not expose the lower electrode 260 and the upper support layer 242 of the second region R2. That is, the hard mask 300 does not expose the upper support layer 242 disposed in the cell region (CELL in FIG. 1) adjacent to the peri region (PERI in FIG. 1).

As illustrated in FIG. 9A, the region exposed by the hard mask 300 may have a square shape. That is, the region exposed by the hard mask 300 may be formed throughout the four lower electrodes 260 in the form of a square. However, this is only for convenience of explanation, and the present disclosure is not limited thereto.

The hard mask 300 may be formed, for example, by depositing a silicon oxide layer or the like, using a physical vapor deposition or a chemical vapor deposition. Subsequently, the hard mask 300 may be patterned, using a photolithography process and an etching process. Alternatively, a trilayer including a photoresist layer, a silicon containing interlayer and a planarization underlayer may be used instead of the silicon oxide layer.

Figure 10A:
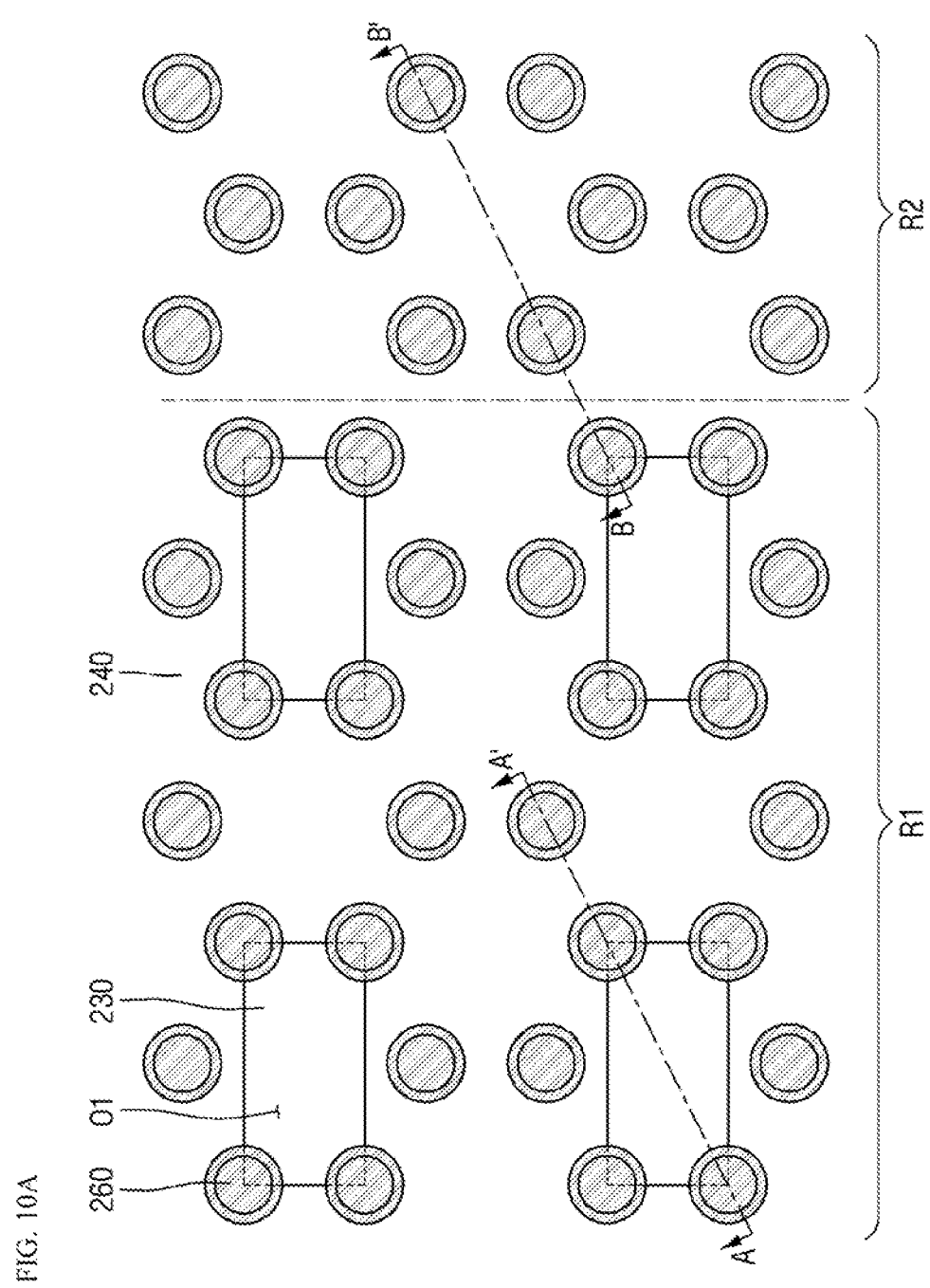
Figure 10B:
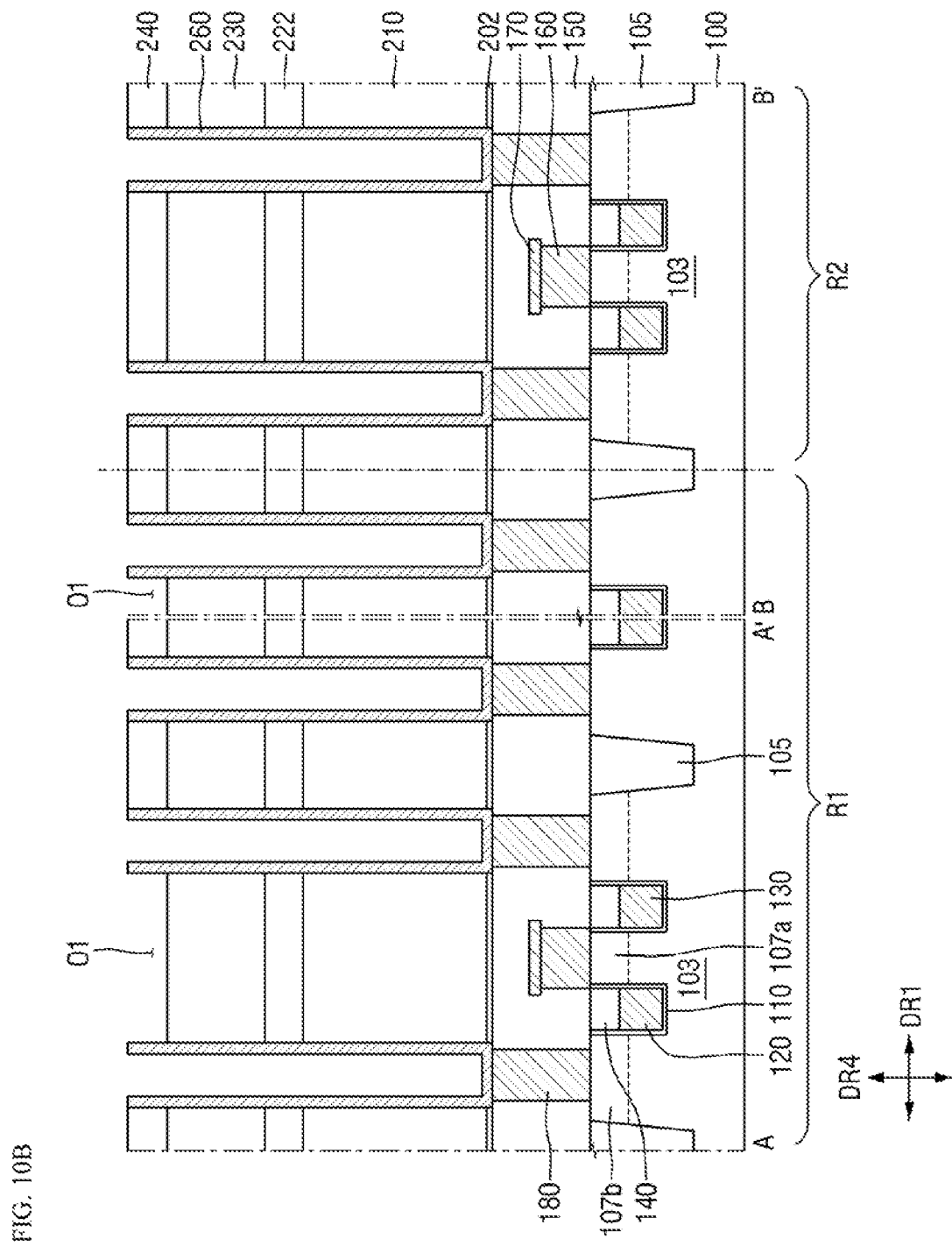

Referring to FIGS. 10A and 10B, a part of the upper support layer 242 is removed, using the hard mask 300 as an etching mask. That is, a part of the upper support layer 242 exposed by the hard mask 300 may be removed to form the upper support pattern 240 including a first opening O1.

A part of the upper support layer 242 in the first region R1 exposed by the hard mask 300 may be removed to form the first opening O1. On the other hand, since the upper support layer 242 in the second region R2 is not exposed by the hard mask 300, an opening is not formed in the second region R2. Therefore, the upper support layer 242 may be patterned to form the upper support pattern 240 through a patterned etching process. After the upper support pattern 240 is formed, the hard mask 300 may be removed.

Patterning of the upper support layer 242 may be performed by, for example, a dry etching process, but the present disclosure is not limited thereto.

Figure 11A:
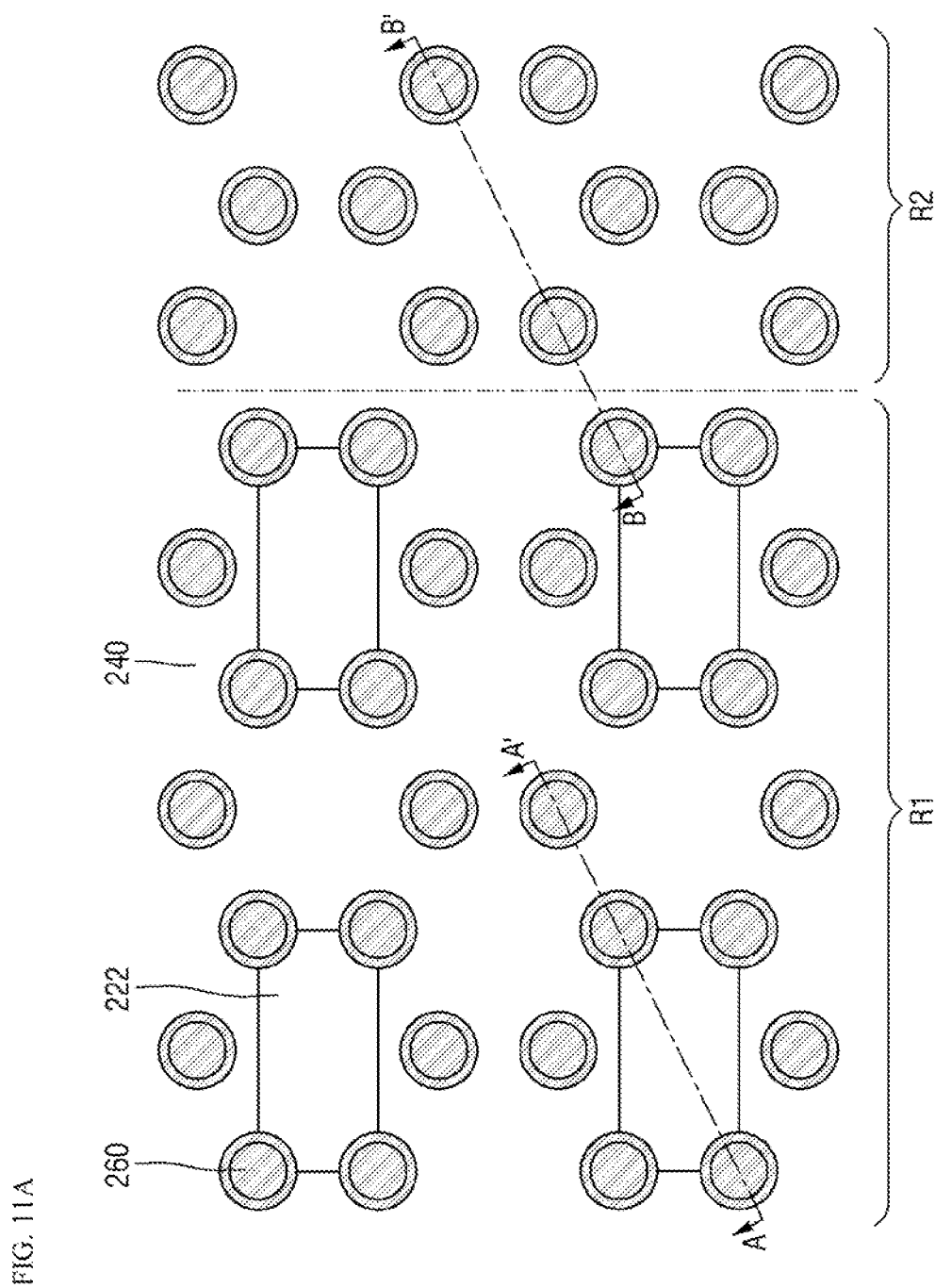
Figure 11B:
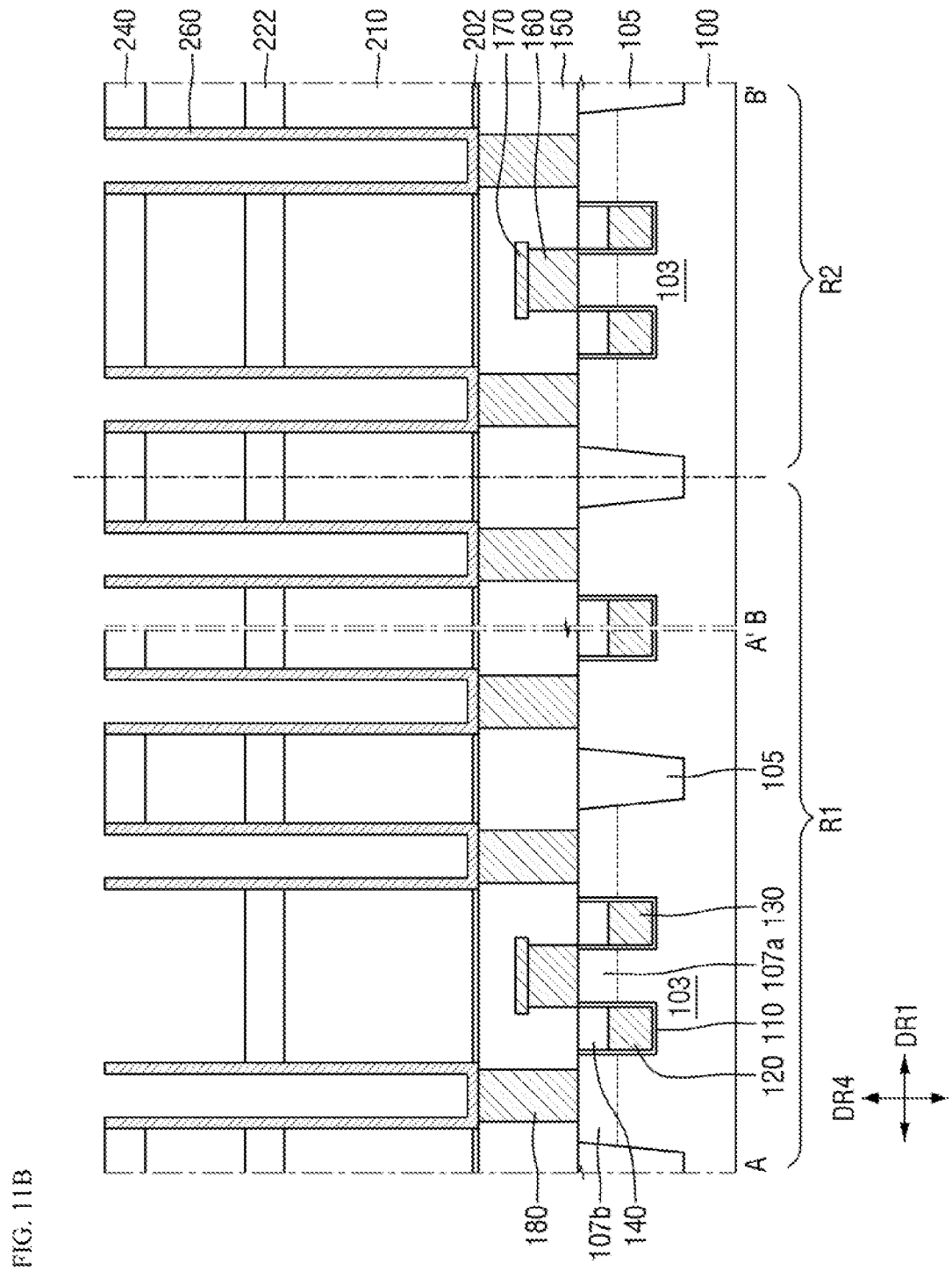

Referring to FIGS. 11A and 11B, the upper mold layer 230 is removed, using the first opening O1 of the upper support pattern 240.

The upper mold layer 230 may be removed by providing an etchant through the first opening O1. For example, when the upper mold layer 230 is formed of a silicon oxide layer, the upper mold layer 230 may be removed by the wet or dry etching, using an etchant capable of selectively removing the silicon oxide layer. The process may be a wet deep-out process. The etchant may be, for example, an etching solution including hydrogen fluoride and ammonium fluoride (LAL solution), but the present disclosure is not limited thereto. When both the hard mask 300 and the upper mold layer 230 are formed of silicon oxide, the hard mask 300 and the upper mold layer 230 may be removed at the same time.

Figure 12A:
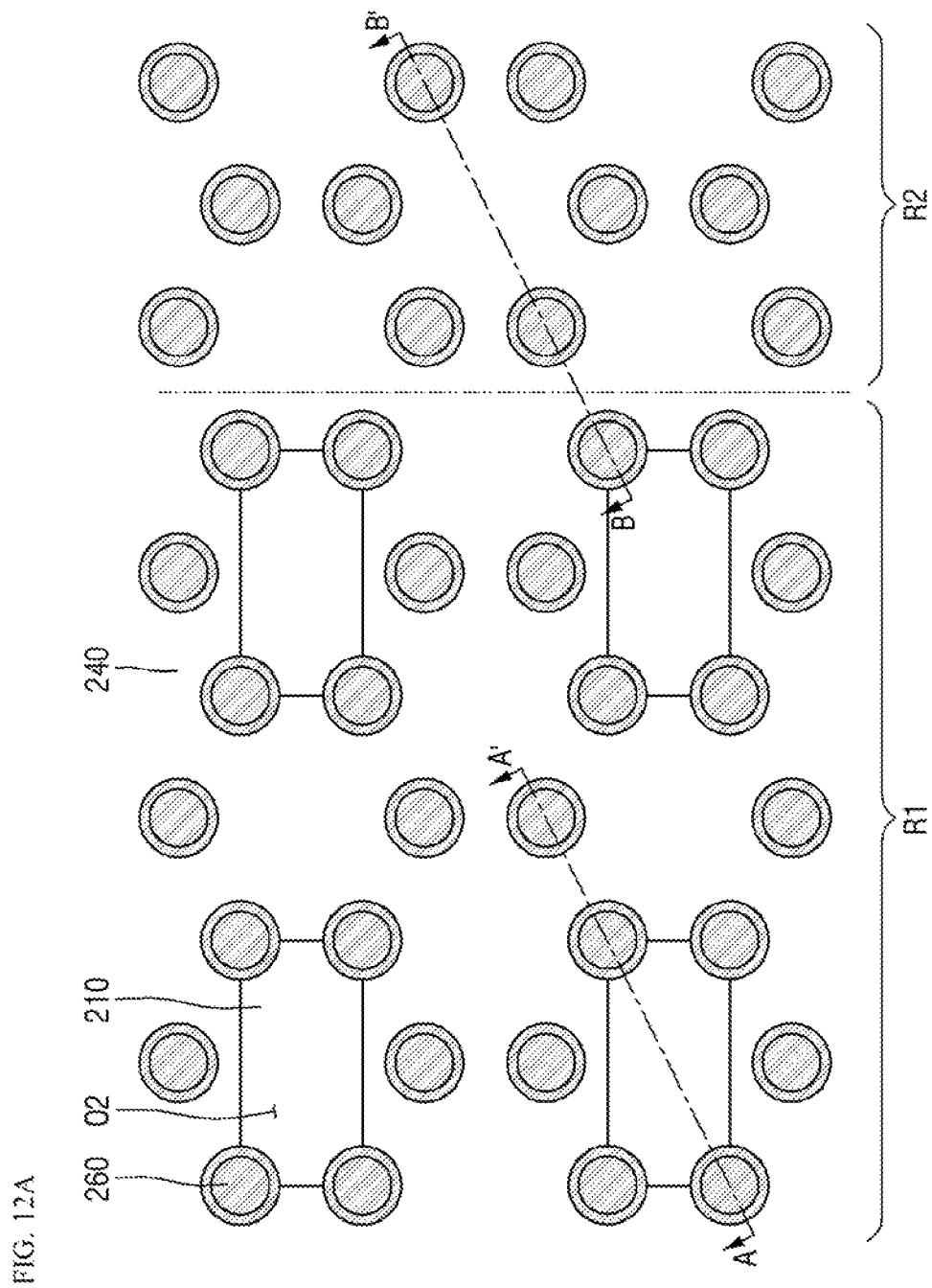
Figure 12B:
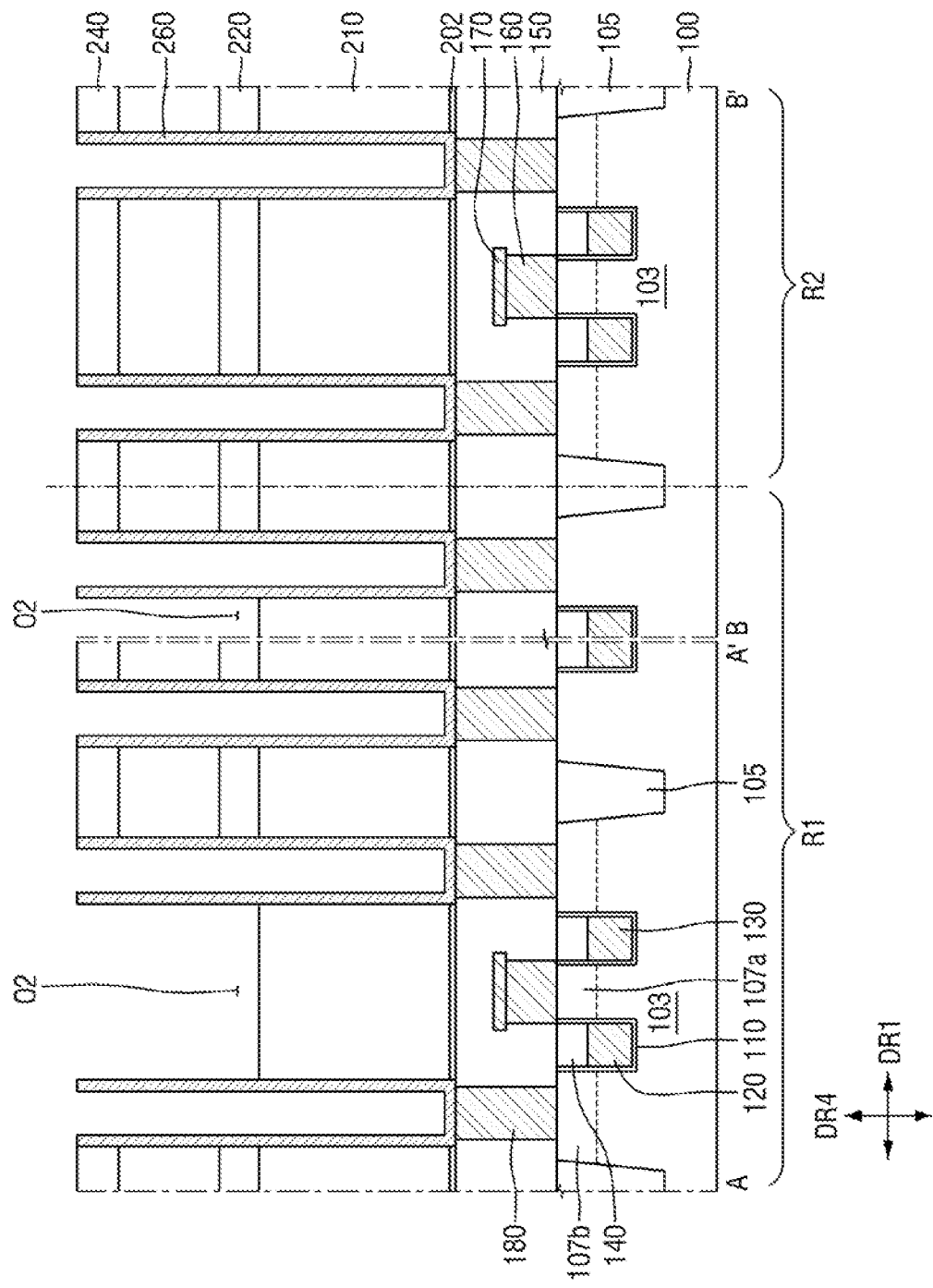

Referring to FIGS. 12A and 12B, a part of the lower support layer 222 is removed, using the upper support pattern 240 as an etching mask. That is, a part of the lower support layer 222 exposed by the upper support pattern 240 may be removed to form the lower support pattern 220 including a second opening O2. Accordingly, the second opening O2 may have a shape which is transferred from the first opening O1. That is, the lower support pattern 220 may have a shape which is transferred from the upper support pattern 240.

A part of the lower support layer 222 in the first region R1 exposed by the upper support pattern 240 may be removed to form the second opening O2. In contrast, since the lower support layer 222 in the second region R2 is not exposed by the upper support pattern 240, an opening is not formed in the second region R2. As a result, the lower support layer 222 may be patterned to form the lower support pattern 220.

Patterning of the lower support layer 222 may be performed, for example, by the wet or dry etching process.

Figure 13B:
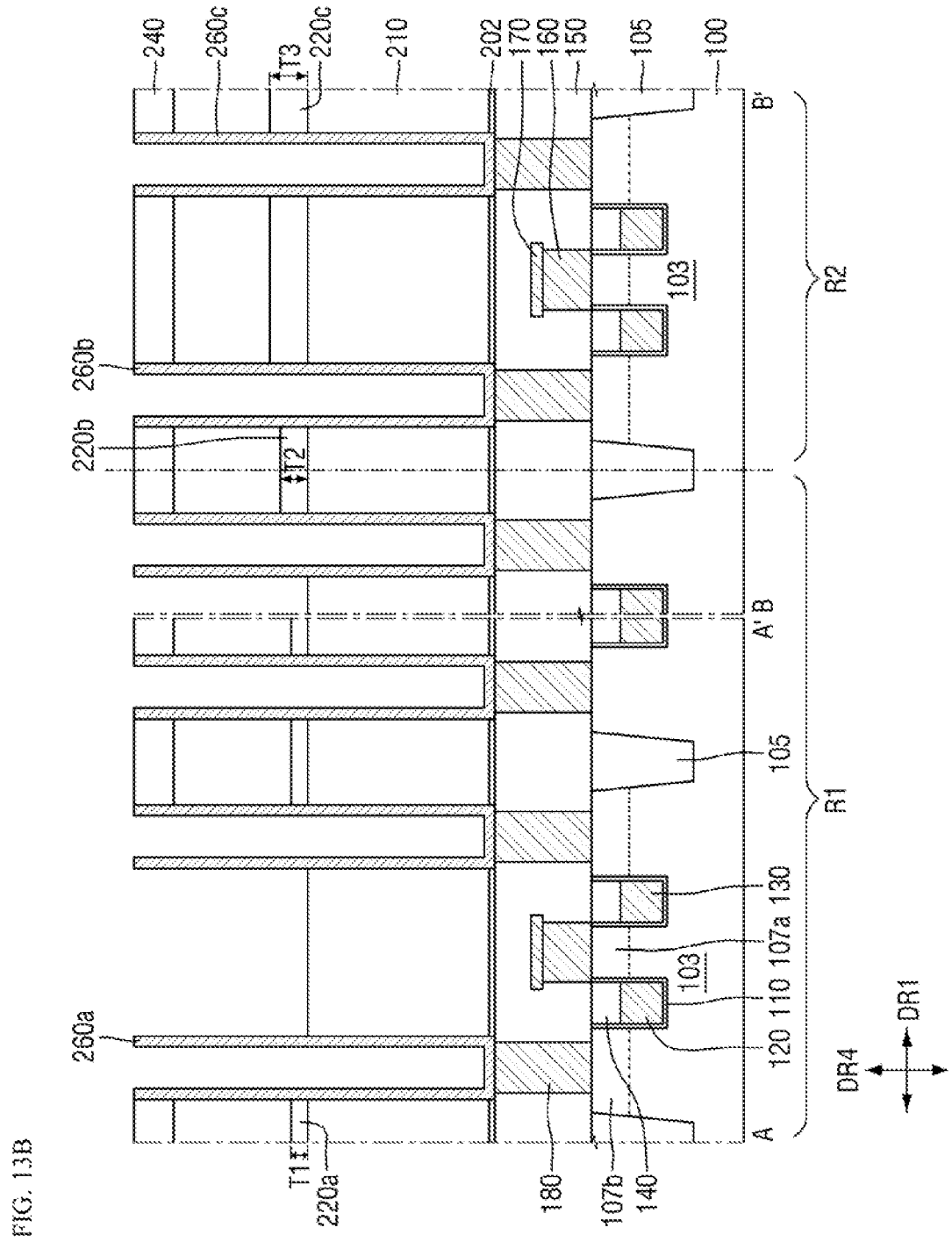
Figure 13C:
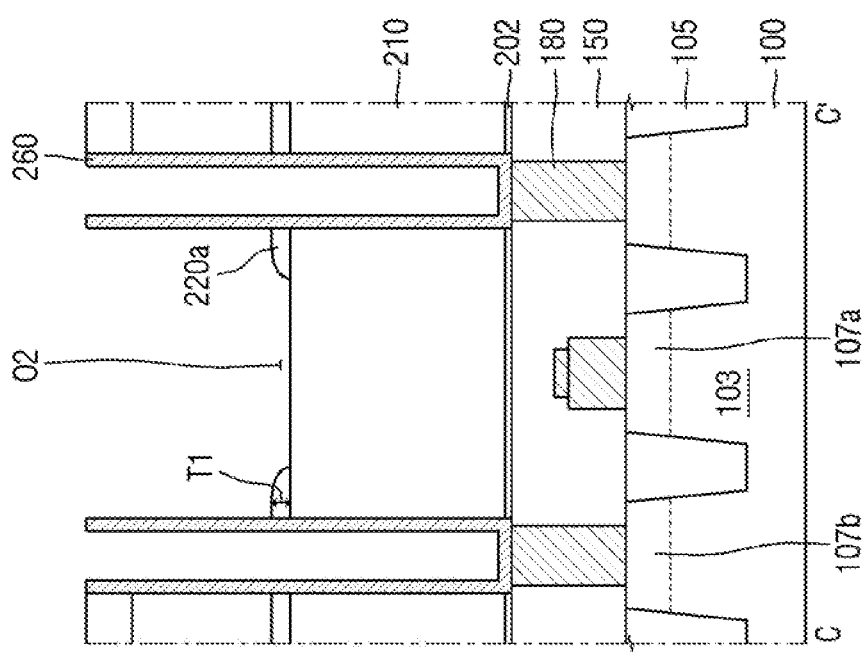

Referring to FIGS. 13A to 13C, a part of the lower support pattern 220 adjacent to the second opening O2 is etched to form the first to third lower support patterns 220a, 220b and 220c. That is, the thickness of the lower support pattern 220 adjacent to the second opening O2 may be reduced, by etching a part of the lower support pattern 220 exposed by the space of the removed upper mold layer 230 through the first and second openings O1 and O2.

The thickness of the first lower support pattern 220a exposed in the first region R1 is reduced to be smaller than the thickness of the lower support patterns 220b and 220c exposed in the second region R2.

An etching process may be performed, by providing the etchant to the first opening O1, the second opening O2, and the lower support pattern 220 exposed by the removed upper mold layer 230. For example, when the lower support pattern 220 is formed of silicon nitride, a part of the upper surface of the lower support pattern 220 can be removed by the wet or dry etching, using the etchant capable of selectively removing the silicon nitride. Therefore, the lower support pattern 220 may form different thicknesses in different regions.

As illustrated, the first region R1 includes first and second openings O1 and O2, and the second region R2 does not include an opening. Therefore, the lower support pattern adjacent to the second opening O2 may be largely influenced by etchant. For example, as illustrated in FIG. 13a, the first lower support pattern 220a formed in the first region R1 may be largely influenced by the etchant through the second openings O2 formed in close vicinity. Therefore, the first lower support pattern 220a is partially etched by the etchant and may have a first thickness T1 smaller than the second and third thicknesses T2 and T3.

In contrast to the first lower support pattern 220a described above, the second and third lower support patterns 220b and 220c formed in the second region R2 including no opening may be less influenced by the etchant. For example, as illustrated in FIG. 13a, a large number of second openings O2 is not formed around the second lower support pattern 220b formed in the second region R2, as compared to the first lower support pattern 220a. That is, the second lower support pattern 220b may be less influenced by the etchant and less etched, as compared to the first lower support pattern 220a. Accordingly, the second lower support pattern 220b may have a second thickness T2 greater than the first thickness T1.

In addition to this, the third lower support pattern 220c disposed to be further spaced apart from the first region R1 than the second lower support pattern 220b may not be influenced by etchant and not etched. For example, as illustrated in FIG. 13a, the third lower support pattern 220c may be disposed to be further spaced apart from the first region R1 and the second opening O2 than the second lower support pattern 220b, and may not be influenced by the etchant and not etched. Accordingly, the third lower support pattern 220c may have a third thickness T3 greater than the first and second thicknesses T1 and T2.

In an exemplary embodiment of the present inventive concept, the thickness of the lower support pattern which varies depending on the region may be adjusted by adjusting the etchant characteristics or the etching process characteristics.

The difference in thickness of the first to third lower support patterns 220a, 220b and 220c may be adjusted, by adjusting the amount or density of etchant. When excessively increasing the amount or density of the etchant, all the first to third lower support patterns 220a, 220b and 220c may be etched during a short etching process time. Therefore, a desired thickness difference between the first to third lower support patterns 220a, 220b and 220c may be formed, by maintaining an appropriate amount or density of etchant for an appropriate period of time.

The difference in thickness of the first to third lower support patterns 220a, 220b and 220c may be adjusted, by adjusting the rate of the etchant. For example, by adjusting the power of the etching apparatus, the rate ratio of etchant in the vertical direction with respect to the horizontal direction may be adjusted. If the rate ratio of etchant in the vertical direction with respect to the horizontal direction is small, the etchant penetrates deeply in the horizontal direction, and the thickness difference between the first to third lower support pattern 220a, 220b and 220c may be small. In contrast, when the rate ratio of etchant in the vertical direction with respect to the horizontal direction is large, the difference in thickness between the first to third lower support patterns 220a, 220b and 220c may be large.

The method for manufacturing a semiconductor device according to an exemplary embodiment of the present inventive concept may provide the lower support patterns having different thicknesses in the first region R1 and the second region R2.

In an exemplary embodiment of the present inventive concept, the lower support pattern may have a shape that increases its thickness as its thickness measurement location goes away from the second opening O2. For example, as illustrated in FIG. 13c, the thickness of the first lower support pattern 220a may increase as its thickness measurement location goes away from the second opening O2. The first lower support pattern 220a adjacent to the second opening O2 may be most intensively influenced by the etchant and most etched. Therefore, the thickness of the first lower support pattern 220a adjacent to the second opening O2 may be the smallest. However, the present disclosure is not limited thereto, and by adjusting the characteristics of the etchant or the etching process characteristics, the first lower support pattern 220a may have substantially the same thickness regardless of its measurement location.

Figure 14A:
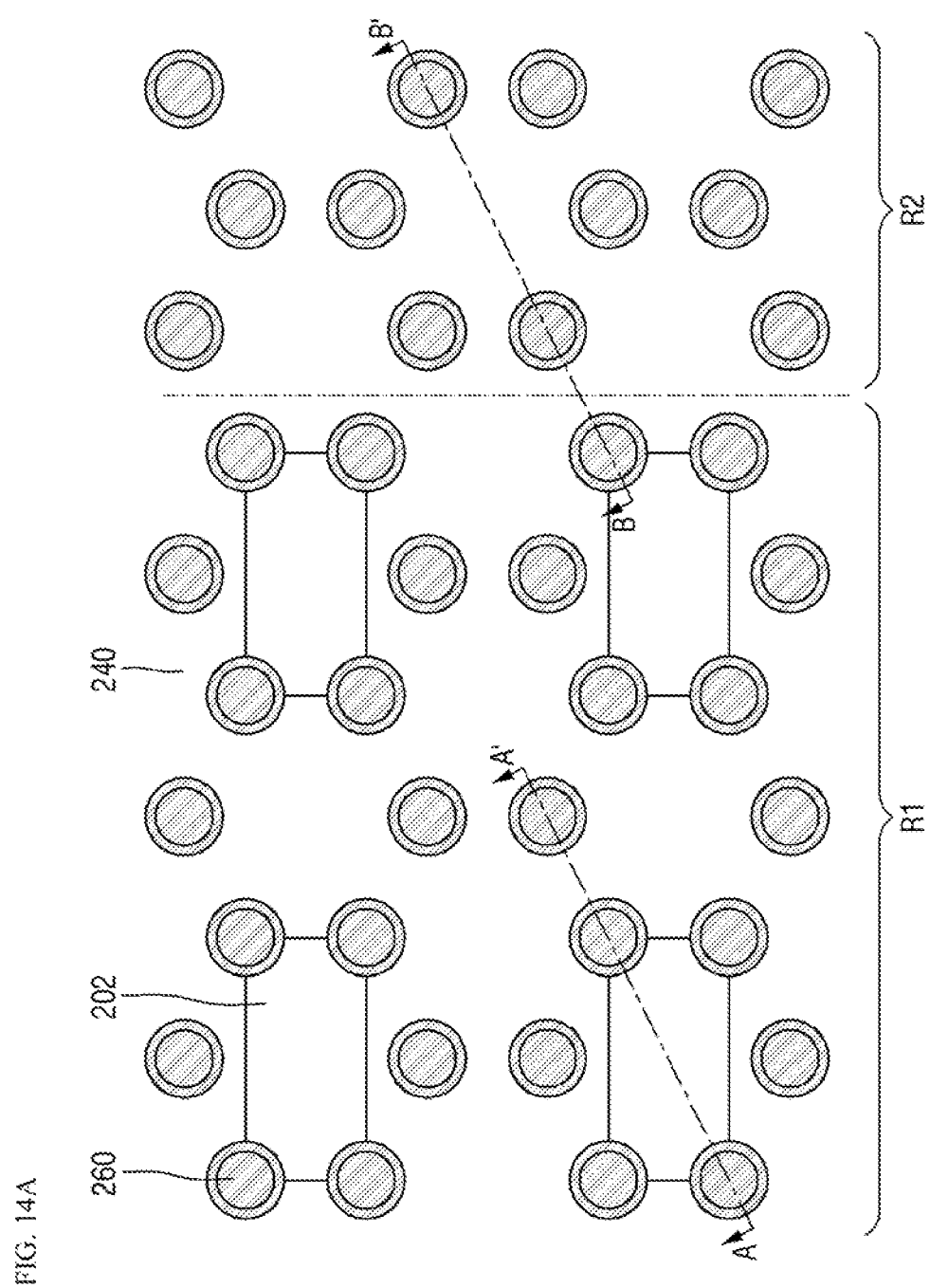
Figure 14B:
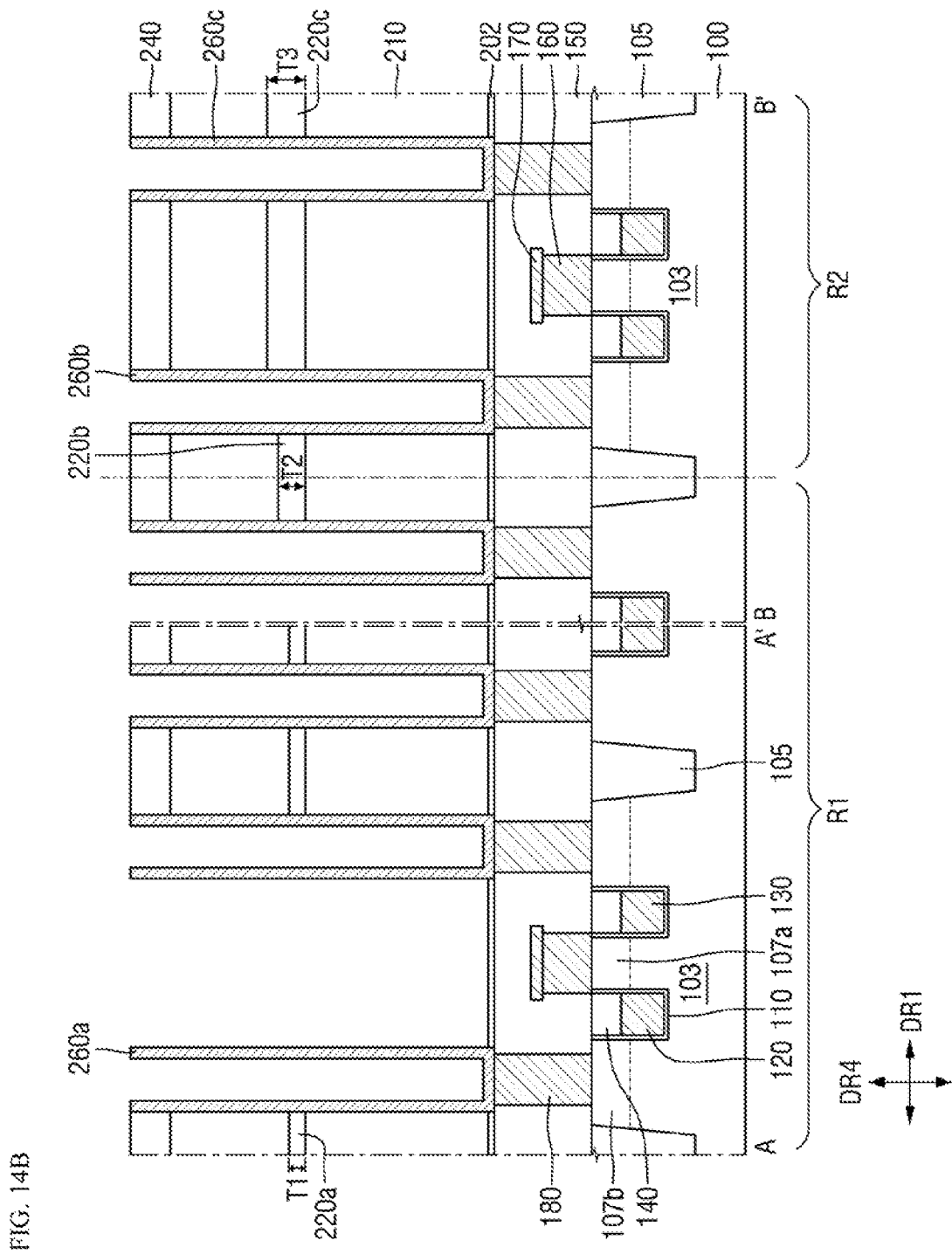

Referring to FIGS. 14A and 14B, the lower mold layer 210 is removed, using the second opening O2 of the lower support pattern 220.

The lower mold layer 210 may be removed, by providing the etchant through the second opening O2. For example, when the lower mold layer 210 is formed of a silicon oxide layer, the lower mold layer 210 may be removed by the wet or dry etching, using the etchant capable of selectively removing the silicon oxide layer. The etchant may be, for example, an LAL solution, but the present disclosure is not limited thereto.

Figure 15:
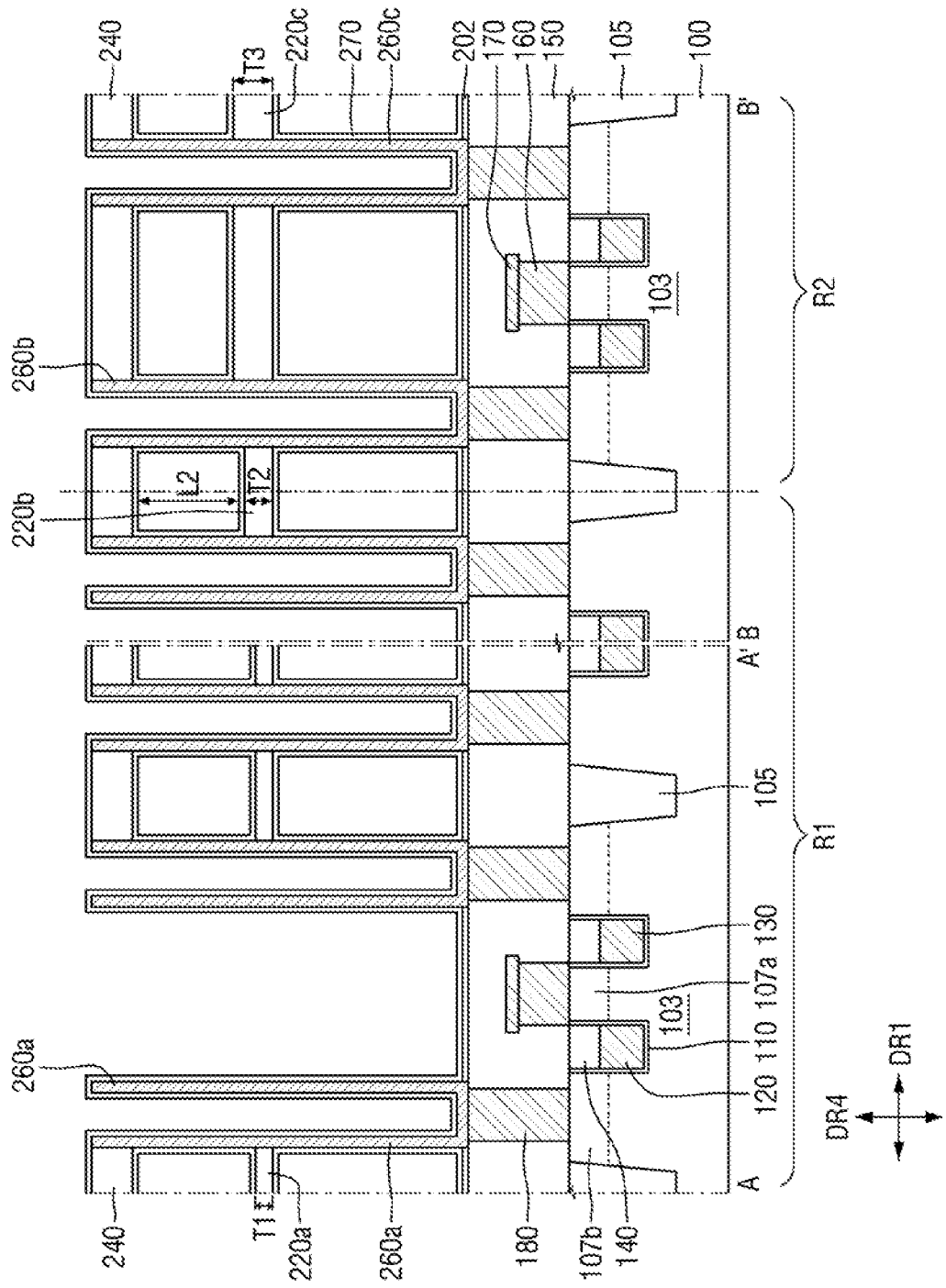

Referring to FIG. 15, the capacitor dielectric layer 270 is formed on the first to third lower electrodes 260a, 260b and 260c, the first to third lower support patterns 220a, 220b and 220c, the etching stopper layer 202, and the upper support patterns 240.

The capacitor dielectric layer 270 may be formed on the first to third lower electrodes 260a, 260b and 260c, the first to third lower support patterns 220a, 220b and 220c, the etching stopper layer 202, and the upper support pattern 240 in a conformal fashion.

Subsequently, the first to third upper electrodes 280a, 280b and 280c are formed on the capacitor dielectric layer 270. Specifically, the first to third upper electrodes 280a, 280b and 280c are formed on the capacitor dielectric layer 270 on the first to third lower electrodes 260a, 260b and 260c in a conformal fashion. In other words, the first to third upper electrodes 280a, 280b and 280c may be formed on the capacitor dielectric layer 270 over the first to third lower electrodes 260a, 260b and 260c, the first to third lower support patterns 220a, 220b and 220c, the etching stopper layer 202, and the upper support pattern 240. Therefore, the semiconductor device 1 according to FIG. 3 can be formed.

When the lower support pattern is formed to be excessively thin, cracks may occur in the lower support pattern. In particular, the edges of the cell region are most vulnerable to stress, and cracks are likely to occur in these areas. By adjusting the etchant characteristics or the etching process characteristics, the thickness of the lower support patterns 220b and 220c formed in the second region R2, which is the edge of the cell region, may be larger than the thickness of the first lower support pattern 220a formed in the first region R1. Therefore, the method for fabricating the semiconductor device according to an exemplary embodiment of the present inventive concept can prevent cracks of the second and third lower support patterns 220b and 220c arranged in the second region R2 which is vulnerable to the stress.

The method for fabricating the semiconductor device according to an exemplary embodiment of the present inventive concept may allow the first upper electrode 280a extending in the fourth direction DR4 between the first lower support pattern 220a and the upper support pattern 240 to extend long. That is, the area in which the lower electrode 260 and the first upper electrode 280a face each other may be made wider, and the capacitance of the semiconductor device may be enhanced. As a result, the method for fabricating the semiconductor device according to an exemplary of the present inventive concept can provide a semiconductor device having an increased capacitance without the risk of cracking.

Hereinafter, the semiconductor device 2 according to an exemplary embodiment of the present inventive concept will be described with reference to FIG. 16. For the sake of convenience, repeated parts of those described with reference to FIGS. 1 to 15 will be briefly described or omitted.

Figure 16:
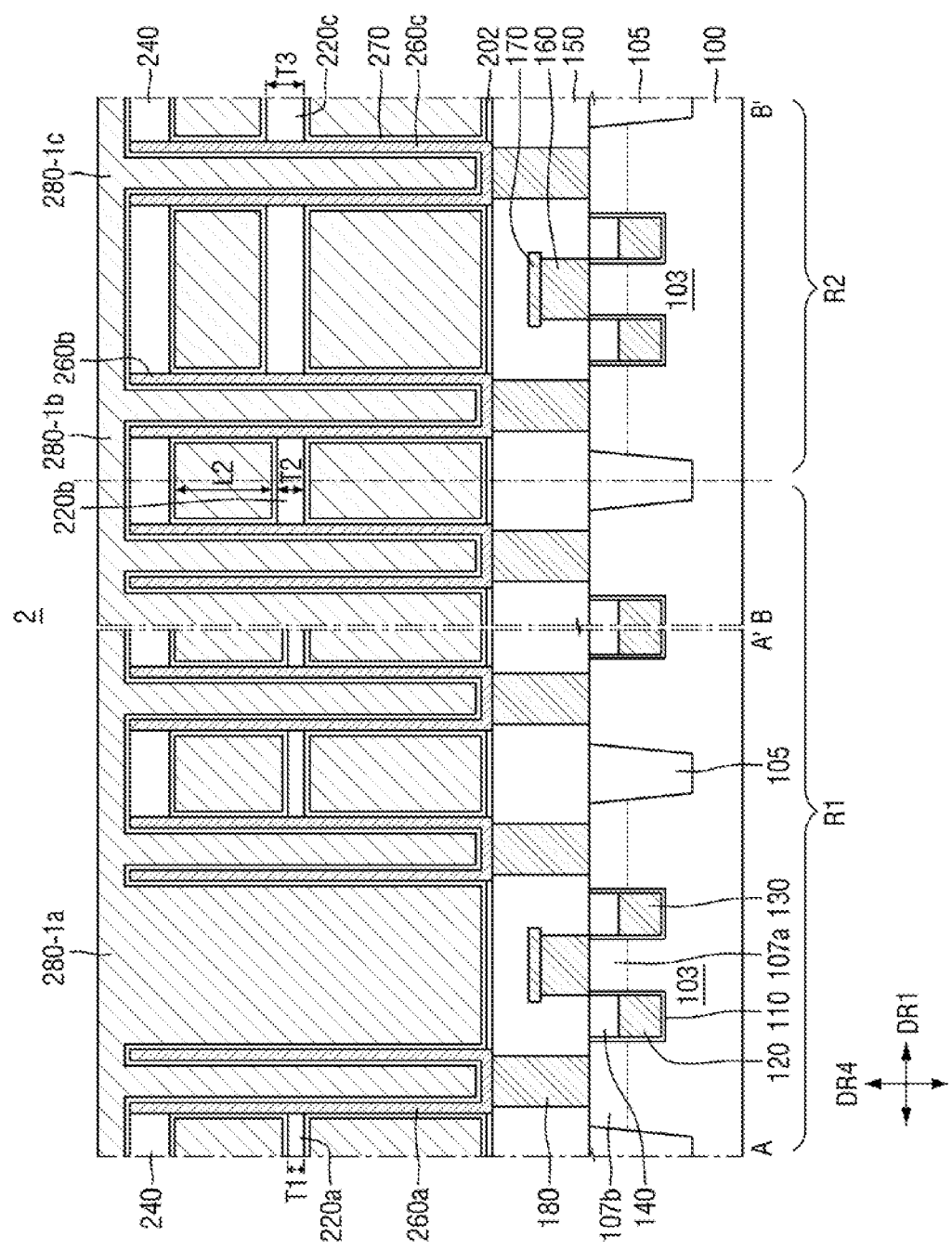
FIG. 16 is a diagram for explaining a semiconductor device according to an exemplary embodiment of the present inventive concept.

FIG. 16 is a diagram for explaining a semiconductor device according to an exemplary embodiment of the present inventive concept.

Referring to FIGS. 3 and 16, the semiconductor device 2 includes first to third upper electrodes 280-1a, 280-1b and 280-1c.

Unlike the first to third upper electrodes 280a, 280b and 280c of the semiconductor device 1 formed on the capacitor dielectric layer 270 in a conformal fashion, the first to third upper electrodes 280-1a, 280-1b and 280-1c may be formed to fill the space. Accordingly, the semiconductor device 2 according to an exemplary embodiment of the present inventive concept can support the capacitor of the semiconductor device formed to have a high aspect ratio through the first to third upper electrodes 280-1a, 280-1b and 280-1c formed to fill the space.

Hereinafter, the semiconductor device 3 according to an exemplary embodiment of the present inventive concept will be described with reference to FIG. 17. For the sake of convenience, repeated parts of those described with reference to FIGS. 1 to 16 will be briefly described or omitted.

Figure 17:
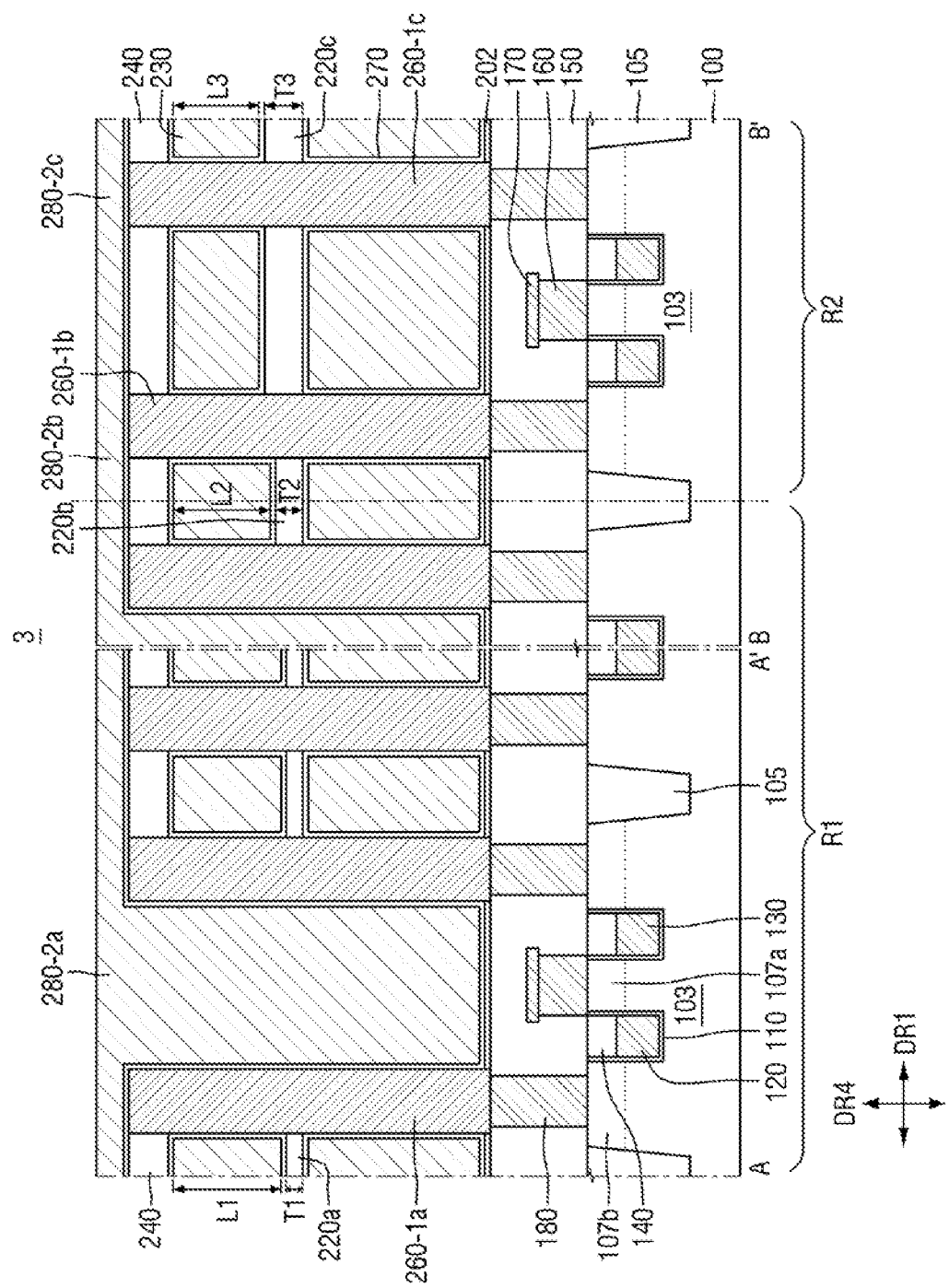
FIG. 17 is a diagram for explaining a semiconductor device according to an exemplary embodiment of the present inventive concept.

FIG. 17 is a diagram for explaining a semiconductor device according to an exemplary embodiment of the present inventive concept.

Referring to FIGS. 3 and 17, the semiconductor device 3 includes first to third lower electrodes 260a-1, 260b-1 and 260c-1, and first to third upper electrodes 280-2a, 280-2b and 280-2c.

Unlike the first to third lower electrodes 260a, 260b and 260c of the semiconductor device 1 formed in a cylinder shape, the first to third lower electrodes 260a-1, 260b-1 and 260c-1 may be formed into a pillar shape. Therefore, the semiconductor device 3 according to an exemplary embodiment of the present inventive concept can prevent leaning or bending which may occur in the lower electrode during the process of removing the mold layer.

Unlike the first to third upper electrodes 280a, 280b and 280c of the semiconductor device 1 formed on the capacitor dielectric layer 270 in a conformal fashion, the first to third upper electrodes 280-2a, 280-2b and 280-2c may be formed to fill the space. Accordingly, the semiconductor device 3 according to an exemplary embodiment of the present inventive concept can support the capacitor of the semiconductor device formed to have a high aspect ratio through the first to third upper electrodes 280-2a, 280-2b and 280-2c formed to fill the space.

While the present inventive concept has been particularly illustrated and described with reference to specific exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A method for fabricating a semiconductor device comprising:
   providing a substrate which includes a cell region including first and second regions, and a peri region more adjacent to the second region than adjacent to the first region;
   forming an insulating layer on the substrate, the insulating layer including a lower mold layer, a lower support layer, an upper mold layer and an upper support layer, which are sequentially stacked;
   forming a contact hole in the insulating layer;
   forming a lower electrode in the contact hole;
   patterning the upper support layer to form an upper support pattern, the upper support pattern including a first opening in the first region;
   removing the upper mold layer using the upper support pattern;
   patterning the lower support layer to form a lower support pattern, the lower support pattern including a second opening in the first region; and
   reducing a thickness of the lower support pattern in the first region using the first and second openings, so that the thickness of the lower support pattern in the first region is smaller than a thickness of the lower support pattern in the second region,
   wherein the thickness of the lower support pattern in the first region and the thickness of the lower support pattern in the second region are measured in a thickness direction of the substrate.

2. The method of claim 1, wherein reducing the thickness of the lower support pattern in the first region includes providing an etchant to the first opening, the second opening and the lower support pattern exposed by the removed upper mold layer.

3. The method of claim 2, wherein reducing the thickness of the lower support pattern in the first region includes adjusting the thickness of the lower support pattern in the first region by adjusting at least one of an amount of the etchant, a density of the etchant and a rate of the etchant.

4. The method of claim 2, wherein the lower support pattern includes silicon nitride.

5. The method of claim 1, wherein reducing the thickness of the lower support pattern in the first region includes removing a part of an upper surface of the lower support pattern.

6. The method of claim 1, wherein forming the lower support pattern includes etching the lower support layer using the upper support pattern as an etching mask.

7. The method of claim 1, further comprising removing the lower mold layer using the lower support pattern.

8. The method of claim 1, further comprising:
forming a capacitor dielectric layer on the lower electrode, the lower support pattern and the upper support pattern; and
forming an upper electrode on the capacitor dielectric layer.

9. The method of claim 8, wherein forming the capacitor dielectric layer and the upper electrode is performed after reducing the thickness of the lower support pattern in the first region.

10. The method of claim 1, further comprising:
forming a unit active region including first and second source/drain regions, in the substrate;
forming a word line between the first and second source/drain regions; and
forming first and second contact plugs electrically connected to the first and second source/drain regions, respectively,
wherein the first contact plug is electrically connected to a bit line, and
the second contact plug is electrically connected to the lower electrode.

11. A method for fabricating a semiconductor device comprising:
providing a substrate which includes a cell region including first and second regions, and a peri region more adjacent to the second region than adjacent to the first region, and also includes contact plugs in the cell region with top surfaces exposed;
sequentially forming a lower mold layer, a lower support layer, an upper mold layer and an upper support layer on the substrate;
forming contact holes extending in a first direction intersecting with the substrate through the upper support layer, the upper mold layer, the lower support layer and the lower mold layer to expose the contact plugs in the first and second regions;
forming a first lower electrode on a sidewall and a bottom of the contact hole in the first region to be electrically connected to the contact plug in the first region, and a second lower electrode on a sidewall and a bottom of the contact hole in the second region to be electrically connected to the contact plug in the second region;
removing a part of the upper support layer through patterned etching in the first region to form an upper support pattern including a first opening;
removing the upper mold layer through the first opening;
removing a part of the lower support layer using the upper support pattern as an etching mask through etching to form a first lower support pattern including a second opening in the first region, and to form a second lower support pattern in the second region;
removing the lower mold layer through the second opening;
forming a dielectric layer on surfaces of the first and second lower electrodes, the first and second lower support patterns, and the upper support pattern; and
forming first and second upper electrodes on a surface of the dielectric layer of the first and second regions, respectively,
wherein a thickness of the first lower support pattern is smaller than a thickness of the second lower support pattern, and
the thickness of the first lower support pattern and the thickness of the second lower support pattern are measured in the first direction.

12. The method of claim 11, wherein a length of the first upper electrode extending in the first direction between the first lower support pattern and the upper support pattern is larger than a length of the second upper electrode extending in the first direction between the second lower support pattern and the upper support pattern.

13. The method of claim 11, wherein the thickness of the first lower support pattern increases as thickness measurement location of the first lower support pattern goes away from the second opening.

14. The method of claim 11, wherein the upper and lower mold layers comprise silicon oxide, and
the removing of the upper mold layer and the removing of the lower mold layer comprise an etching process using an etching solution which includes hydrogen fluoride and ammonium fluoride.

15. The method of claim 11, wherein the thickness of the first lower support pattern is about 80 Å to 200 Å.

16. The method of claim 11, wherein the thickness of the second lower support pattern is about 250 Å to 300 Å.

17. A method for fabricating a semiconductor device comprising:
providing a substrate which includes a cell region including first and second regions, and a peri region more adjacent to the second region than adjacent to the first region, and also includes contact plugs in the cell region with top surfaces exposed;
sequentially forming a lower mold layer, a lower support layer, an upper mold layer and an upper support layer on the substrate;
forming contact holes extending in a first direction intersecting with the substrate through the upper support layer, the upper mold layer, the lower support layer and the lower mold layer to expose the contact plugs in the first and second regions;
forming a lower electrode on sidewalls and bottoms of the contact holes to be electrically connected to the contact plugs;
removing a part of the upper support layer through patterned etching in the first region to form an upper support pattern including a first opening;
removing the upper mold layer through the first opening;
removing a part of the lower support layer using the upper support pattern as an etching mask through etching to form a lower support pattern including a second opening in the first region;
removing the lower mold layer through the second opening;
forming a dielectric layer on surfaces of the lower electrode, the lower support pattern, and the upper support pattern; and
forming first and second upper electrodes on a surface of the dielectric layer of the first and second regions, respectively,
wherein a length of the first upper electrode extending in the first direction between the lower support pattern and the upper support pattern is larger than a length of the second upper electrode extending in the first direction between the lower support pattern and the upper support pattern.

18. The method of claim 17, wherein an upper surface of the first upper electrode between the lower support pattern and the upper support pattern, and an upper surface of the second upper electrode between the lower support pattern and the upper support pattern are disposed on substantially the same plane.

19. The method of claim 17, further comprising:
forming a third upper electrode in the second region, the third upper electrode being further spaced apart from the first region as compared with the second upper electrode,
wherein a length of the third upper electrode extending in the first direction between the lower support pattern and the upper support pattern is smaller than the length of the second upper electrode extending in the first direction between the lower support pattern and the upper support pattern.

20. The method of claim 17, wherein the first and second upper electrodes are disposed on the surface of the dielectric layer in a conformal fashion.

* * * * *